US011068680B1

(12) United States Patent
Kállay et al.

(10) Patent No.: US 11,068,680 B1
(45) Date of Patent: Jul. 20, 2021

(54) LATCH AND HINGE SYSTEMS FOR BASE STATIONS AND HANDHELD DEVICES

(71) Applicant: Cognex Corrporation, Natick, MA (US)

(72) Inventors: János Kállay, Gödöllő (HU); Saul Sanz Rodriguez, Aachen (DE); Kai Fluegge, Aachen (DE)

(73) Assignee: COGNEX CORPORATION, Natick, MA (US)

( * ) Notice: Subject to any disclaimer, the term of this patent is extended or adjusted under 35 U.S.C. 154(b) by 0 days.

(21) Appl. No.: 16/851,802

(22) Filed: Apr. 17, 2020

(51) Int. Cl.
G06K 7/10 (2006.01)
G06K 7/14 (2006.01)
H05K 5/02 (2006.01)

(52) U.S. Cl.
CPC ....... G06K 7/10881 (2013.01); G06K 7/1413 (2013.01); H05K 5/0226 (2013.01); H05K 5/0247 (2013.01); G06K 2007/10524 (2013.01)

(58) Field of Classification Search
None
See application file for complete search history.

(56) References Cited

U.S. PATENT DOCUMENTS

| 5,767,501 A | 6/1998 | Schmidt et al. |
| 5,888,087 A | 3/1999 | Hanson et al. |
| 8,662,399 B2 | 3/2014 | Vassura et al. |
| 10,224,726 B1 | 3/2019 | Fluegge et al. |
| 2006/0145039 A1 | 7/2006 | Shawver |
| 2009/0021375 A1* | 1/2009 | Stagg ............... G06K 7/109 340/572.1 |
| 2016/0094070 A1* | 3/2016 | Mazzone ............ H02J 50/10 320/115 |
| 2017/0220076 A1 | 8/2017 | Gerbus et al. |
| 2018/0293412 A1* | 10/2018 | Volta .................. H02J 7/00 |

* cited by examiner

Primary Examiner — Kristy A Haupt
(74) Attorney, Agent, or Firm — Quarles & Brady LLP

(57) ABSTRACT

A base station or handheld device can be equipped with a latch system or a multi-hinge arrangement for electrical contacts. The latch system can be adjustable between different latching configurations in which the base station and handheld device are retained together by different degrees. The multi-hinge arrangement can provide rotation about multiple axes to provide rolling contact between electrical contacts of the base station and the handheld device.

20 Claims, 26 Drawing Sheets

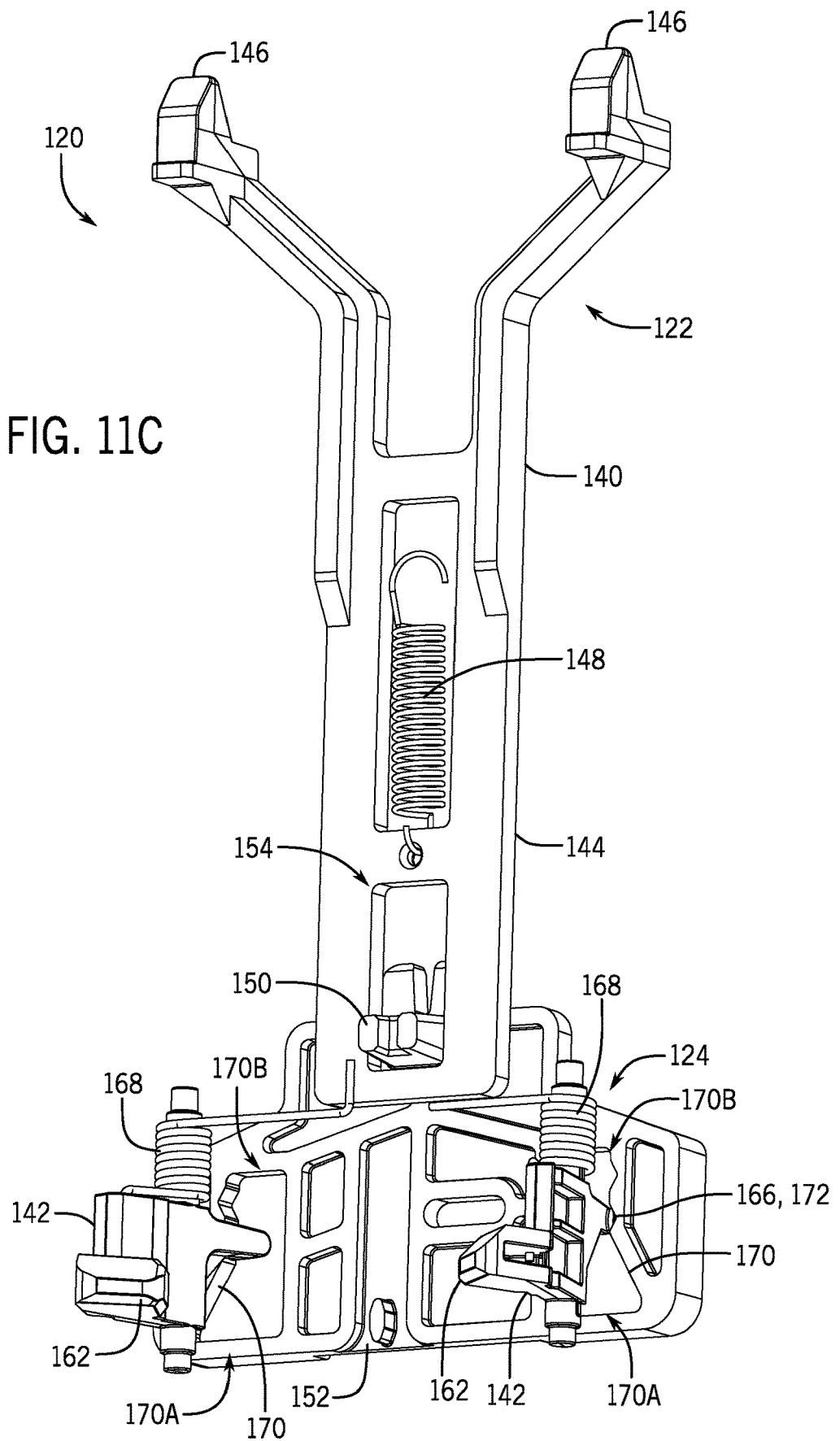

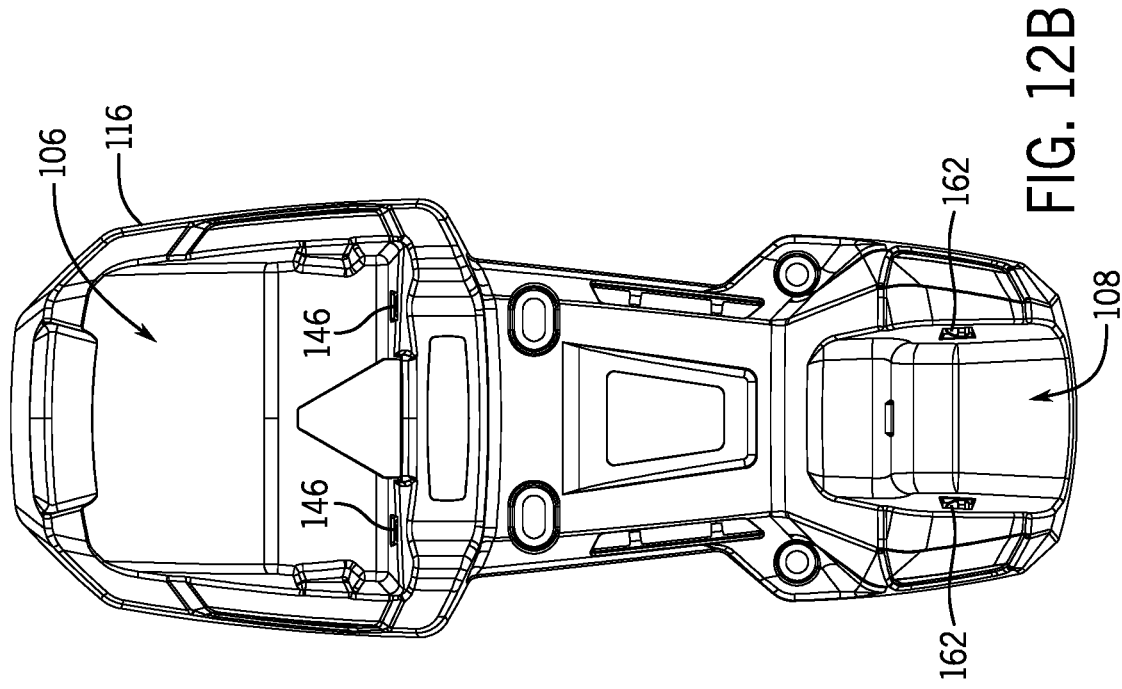
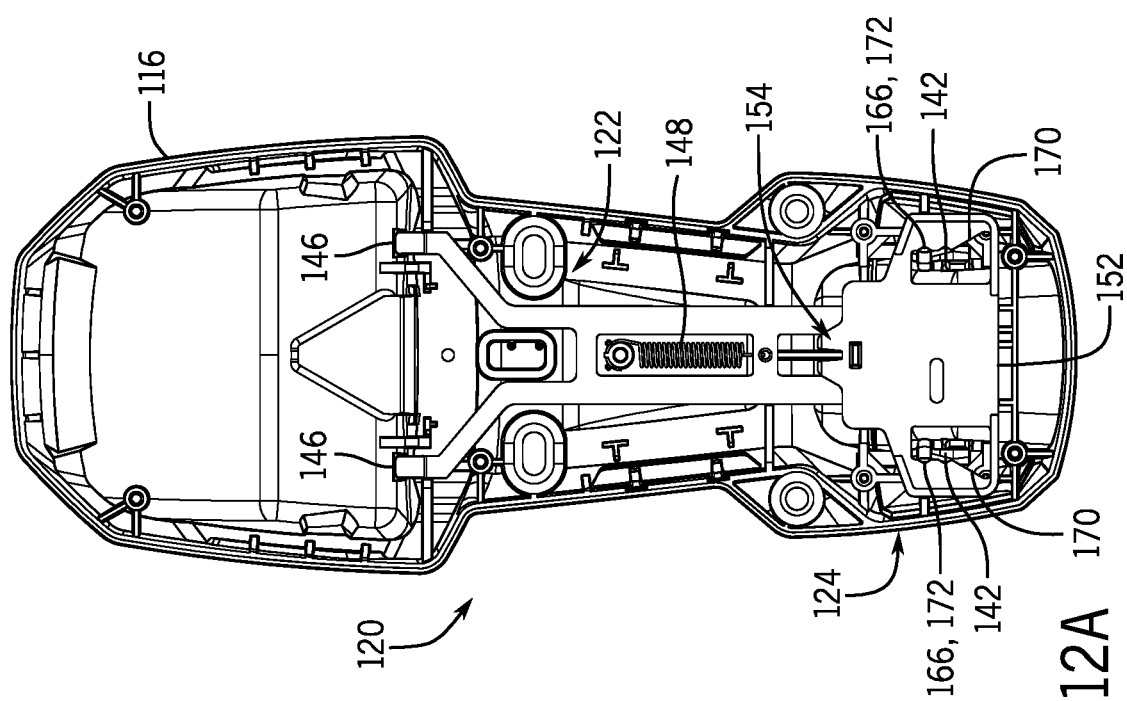

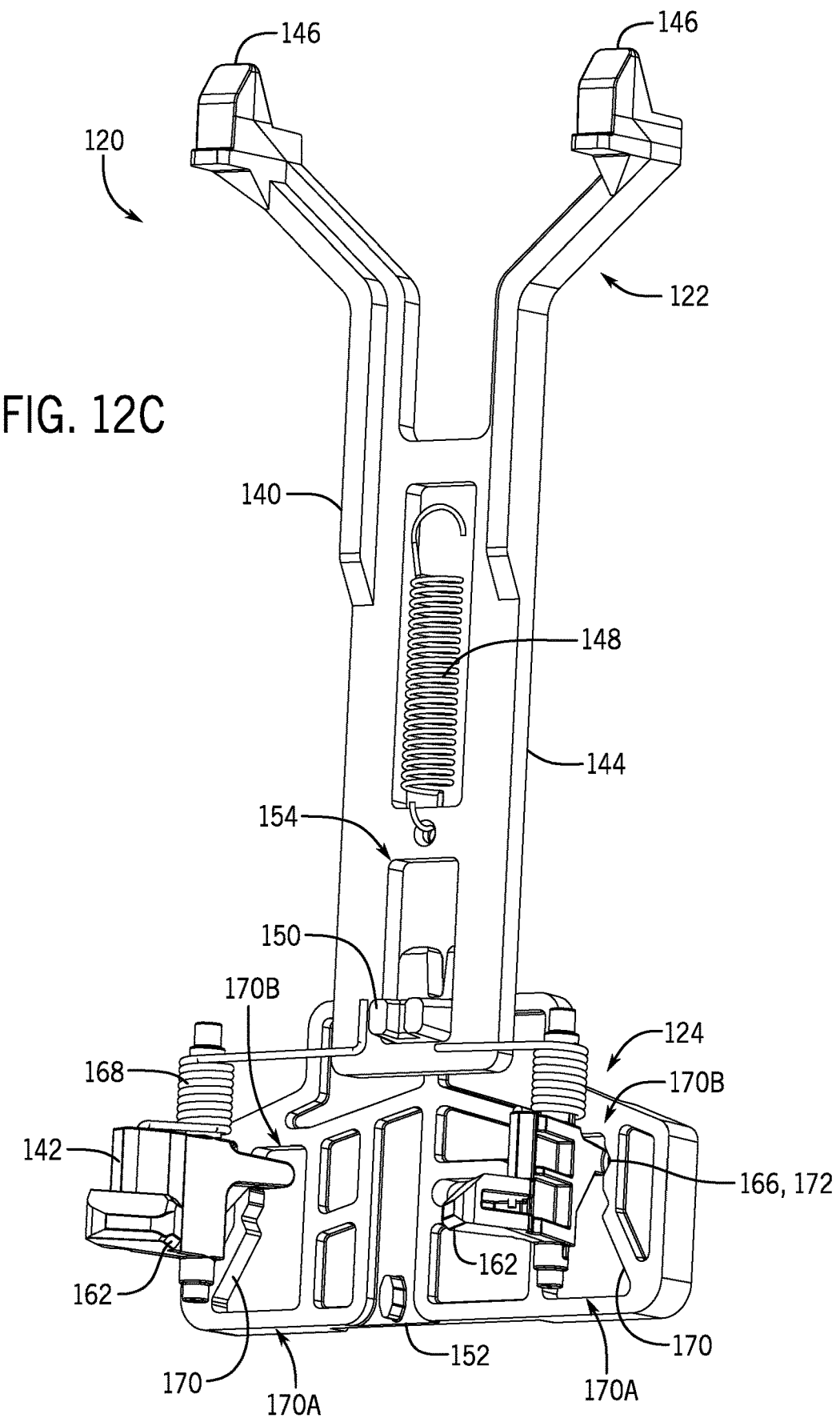

LATCH AND HINGE SYSTEMS FOR BASE STATIONS AND HANDHELD DEVICES

STATEMENT REGARDING FEDERALLY SPONSORED RESEARCH OR DEVELOPMENT

Not applicable.

BACKGROUND

The present technology generally relates to vision systems, for example, handheld bar code readers and base stations for handheld bar code readers.

SUMMARY OF THE TECHNOLOGY

Generally, embodiments of the technology can provide improved base stations and related devices for machine vision systems. In some embodiments, a machine vision system can include a handheld device, for example, a handheld bar code reader. A base station can be configured to receive and secure the handheld device, including to provide electronic charging and data transfer.

Some embodiments of the technology provide a base station for a handheld device, including a housing, a first latch, and a second latch. The first latch can be movable relative to the housing between an extended orientation and a retracted orientation, and can be configured to retain a first part of the handheld device on the housing in the extended orientation and to release the first part of the handheld device in the retracted orientation. The second latch can be movable relative to the housing between an extended orientation and a retracted orientation, and can be configured to retain a second part of the handheld device on the housing in the extended orientation and to release the second part of the handheld device in the retracted orientation.

A control body can be movable relative to the housing between first, second, and third control orientations to selectively dispose the first and second latches in, respectively, first, second, and third latching configurations. In the first latching configuration, the first and second latches can be the extended orientation. In the second latching configuration, the first latch can be in the extended orientation and the second latch can be in the retracted orientation. In the third latching configuration, first and second latches can be in the retracted orientation.

Some embodiments provide a latch system for a base station and a handheld device, including a housing of one of the base station or the handheld device. A first latch member can include a first latch portion and a first body portion enclosed by the housing. The first body portion can be slidably secured within the housing to be slidable between an extended orientation and a retracted orientation, with the first latch portion extending farther out of the housing with the first body portion in the extended orientation than with the first body portion in the retracted orientation. A second latch member can include a second latch portion and a second body portion enclosed by the housing. The second body portion can be rotatably secured within the housing to be rotatable between an extended orientation and a retracted orientation, with the second latch portion extending farther out of the housing with the second body portion in the extended orientation than with the second body portion in the retracted orientation.

A control body can be engaged with the first body portion and the second body portion. The control body can be movable relative to the housing between two or more control orientations to selectively dispose latch system in, respectively, two or more of a first latching configuration, a second latching configuration, or a third latching configuration. In the first latching configuration, the first and second body portions can be in the extended orientation. In the second latching configuration, the first body portion can be in the extended orientation and the second body portion can be in the retracted orientation. In the third latching configuration, the first and second body portions can be in the retracted orientation.

Some embodiments, provide a base station for a handheld device. The base station can include a housing, a first latch member, a second latch member, and a control body. The housing can include a first well configured to receive a head end of the handheld device and a second well configured to receive a base end of the handheld device. The first latch member can include a first body portion with one of a slot or a protrusion, and a first latching end configured to engage the handheld device within the first well. The second latch member can include a second body portion, and a second latching end configured to engage the handheld device within the second well. The control body can include an angled control profile and one of a protrusion or a slot.

The first latch member can be biased toward an extended orientation and can be slidable within the housing between the extended orientation and a retracted orientation, with the first latching end extending farther out of the housing to engage the handheld device with the first latch member in the extended orientation than with the first latch member in the retracted orientation. The second latch member can be biased towards an extended orientation and can be rotatable within the housing between an extended orientation and a retracted orientation, with the second latching end extending farther out of the housing to engage the handheld device with the second latch member in the extended orientation than with the second latch member in the retracted orientation.

The control body can be selectively slidable relative to the housing between two or more control orientations to selectively move the first and second latch members from a first latching configuration, in which the first and second latch members are in the extended orientation, to one or more of a second latching configuration or a third latching configuration. In the second latching configuration, the first latch member can be in the extended orientation and the angled control profile can be engaged with the second body portion to hold the second latch member in the retracted orientation. In the third latching configuration, the one of the protrusion or the slot of the control body can be engaged with the one of the slot or the protrusion of the first latch member to hold the first latch member in the retracted orientation and the angled control profile can be engaged with the second body portion to hold the second latch member in the retracted orientation.

Some embodiments of the technology provide a base station for a handheld device with a device electrical contact. The base station can include a housing, a first hinge member, and a second hinge member. The first hinge member can include a docking contact and can be rotatably secured to the housing. The second hinge member can include a base-station electrical contact and can be rotatably secured to the first hinge member. The docking contact, when the first hinge member is in a rest orientation, can be exposed to an exterior of the housing to be contacted by the handheld device as the handheld device is partially docked on the base station. Accordingly, the handheld device can cause the first hinge member to be rotated in first direction to move the base-station electrical contact into engagement with the device electrical contact. The second hinge member can be configured to rotate in a second direction relative to the first hinge member, due to contact with the device electrical contact, while maintaining rolling contact with the device electrical contact, as the handheld device is fully docked on the base station.

In some embodiments, a first hinge member of a base station can include a first pin, a docking contact to a first side of the first pin, and a support portion to a second side of the first pin opposite the first side. The first pin can be configured to rotatably secure the first hinge member to a housing of the base station for rotation about a first axis through the first pin. A second hinge member can include a connection portion secured to the support portion of the first hinge member, and a base-station electrical contact that is secured to the connection portion and is configured to rotate relative to the first hinge member about a second axis that is different from the first axis. The docking contact can be exposed to an exterior of the housing with the first hinge member in a rest orientation and the base-station electrical contact can be exposed to an exterior of the housing in an actuated orientation.

The first hinge member can be configured to rotated in a first direction about the first axis, from the rest orientation, upon contact of the handheld device with the docking contact, to rotate the second hinge member in the first direction about the first axis. The second hinge member can be configured to be rotated relative to the first hinge member, in a second direction about the second axis, upon engagement of the base-station electrical contact with the device electrical contact.

Some embodiments of the technology provide a machine vision system that can include a handheld device with a device electrical contact, and a base station that includes a housing, a first hinge member, and a second hinge member. The housing can have a well configured to receive a head of the handheld device. The first hinge member can be secured to the housing for rotation about a first axis and can include a docking contact that extends through a first wall of the well when the first hinge member is in a rest orientation. The second hinge member can be secured to the first hinge member for rotation about a second axis that is spaced apart from the first axis, and can include a base-station electrical contact that extends through a second wall of the well when the second hinge member is in an actuated orientation.

The handheld device can be configured to be moved into the well to be docked in electrical communication with the base station. The first hinge member can be configured to be rotated about the first axis by the handheld device as the handheld device is moved into the well, to move the base-station electrical contact into engagement with the device electrical contact. The second hinge member can be configured to be rotated about the second axis by the engagement with the device electrical contact to maintain a rolling contact with the device electrical contact as the first hinge member rotates about the first axis.

To the accomplishment of the foregoing and related ends, the technology, then, comprises the features hereinafter fully described. The following description and the annexed drawings set forth in detail certain illustrative aspects of the technology. However, these aspects are indicative of but a few of the various ways in which the principles of the technology can be employed. Other aspects, advantages and novel features of the technology will become apparent from the following detailed description of the technology when considered in conjunction with the drawings.

BRIEF DESCRIPTION OF THE SEVERAL VIEWS OF THE DRAWINGS

FIG. 11C is an isolated view of the multi-point latch system of FIG. 3 in the second latching configuration.

FIGS. 12A and 12B are bottom and top view, respectively, of the multi-point latch system and the base cover of the base station of FIG. 1 in a third latching configuration.

FIG. 12C is an isolated view of the multi-point latch system of FIG. 3 in the third latching configuration.

Figure 1:
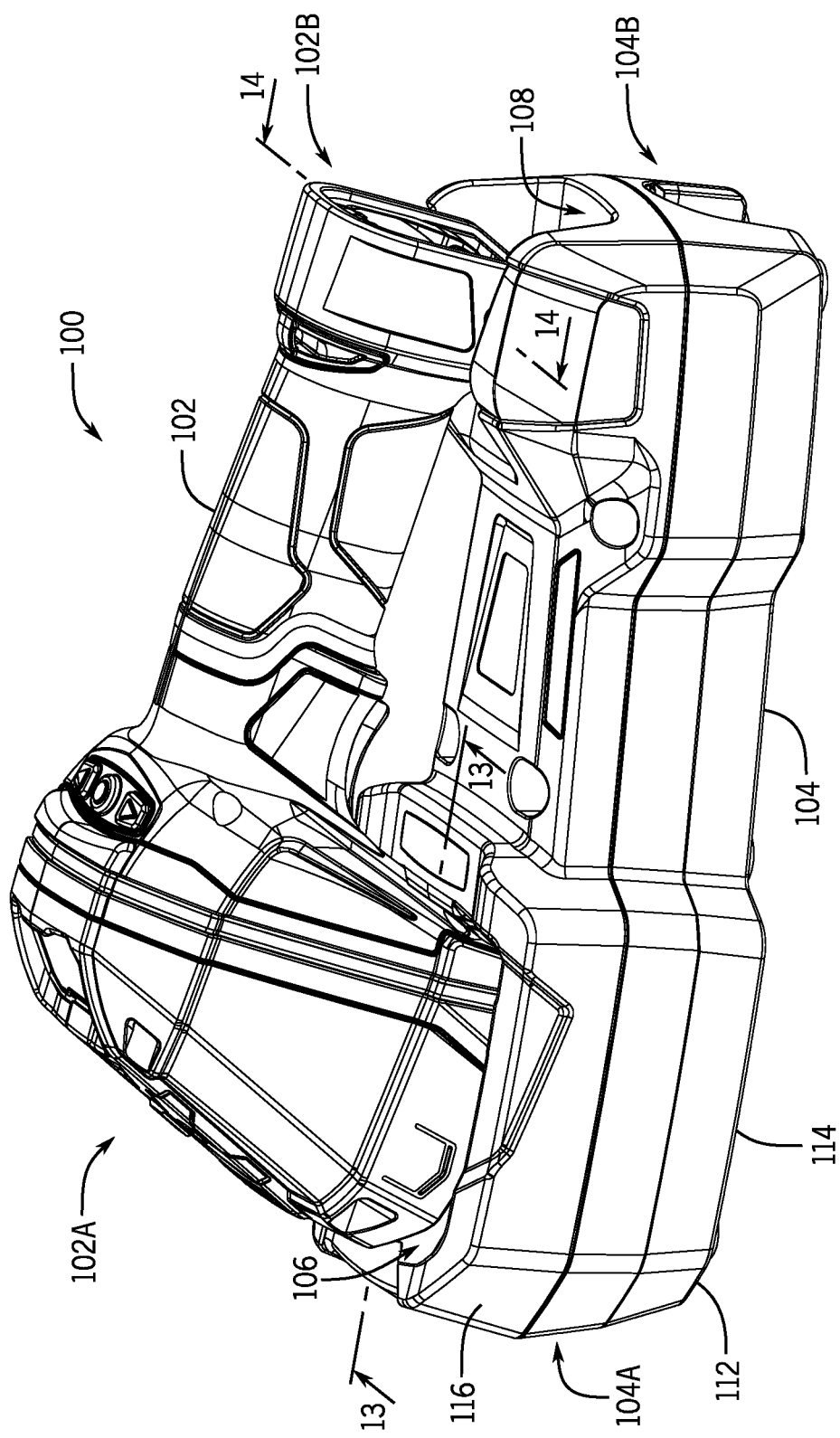
FIG. 1 illustrates a machine vision system including a handheld reader and a base station according to an embodiment of the technology, in a first mounting orientation.

While the technology is susceptible to various modifications and alternative forms, specific embodiments thereof have been shown by way of example in the drawings and are herein described in detail. It should be understood, however, that the description herein of specific embodiments is not intended to limit the technology to the particular forms disclosed, but on the contrary, the intention is to cover all modifications, equivalents, and alternatives falling within the spirit and scope of the technology as defined by the appended claims.

DETAILED DESCRIPTION OF THE TECHNOLOGY

The various aspects of the subject technology are now described with reference to the annexed drawings, wherein like reference numerals correspond to similar elements throughout the several views. It should be understood, however, that the drawings and detailed description hereafter relating thereto are not intended to limit the claimed subject matter to the particular form disclosed. Rather, the intention is to cover all modifications, equivalents, and alternatives falling within the spirit and scope of the claimed subject matter.

Unless otherwise specified or limited, the terms "connected," "mounted," and "coupled" and variations thereof are used broadly and encompass both direct and indirect mountings, connections, supports, and couplings. Further, "connected" and "coupled" are not restricted to physical or mechanical connections or couplings. As used herein, unless expressly stated otherwise, "connected" means that one element/feature is directly or indirectly connected to another element/feature, and not necessarily electrically or mechanically. Likewise, unless expressly stated otherwise, "coupled" means that one element/feature is directly or indirectly coupled to another element/feature, and not necessarily electrically or mechanically.

As used herein, unless otherwise defined or limited, directional terms are used for convenience of reference for discussion of particular figures or examples, not to indicate unchangeable absolute or relative orientations. For example, references to vertical or horizontal orientations may be used to discuss aspects of a particular example or figure, but do not necessarily require similar orientation or geometry in all installations or configurations. Similarly, references to certain components as being above or below other components may be used to indicate relative position of components from a particular reference frame, but do not necessarily require similar relative positions in all installations or configurations.

Additionally, unless otherwise defined or limited, ordinal numbers are used herein for convenience of reference based generally on the order in which particular components are presented for the relevant part of the disclosure. In this regard, for example, designations such as "first," "second," etc., generally indicate only the order in which the relevant component is introduced for discussion and generally do not indicate or require a particular spatial arrangement, functional or structural primacy or order.

Some embodiments of the disclosed technology are described herein in connection with a machine vision system including an electronic machine vision device (e.g., a handheld barcode reader) and associated processing devices. That is because the features and advantages of the disclosure are well suited for this purpose. Still, it should be appreciated that the various aspects of the disclosure can be applied in the context of other types of systems, including machine vision systems other than those specifically discussed herein (e.g., other handheld imaging systems) and any other system that may benefit from secure and durable interfaces between base stations and related modules.

Machine vision systems generally include one or more imaging devices and one or more processing devices (e.g., machine vision "engines") that are configured to automatically analyze certain aspects of acquired images. As such, machine vision systems can be used in manufacturing, assembly, test, measurement, automation, and control applications, among others, as non-limiting examples.

Generally, handheld devices (e.g., handheld imaging or machine vision systems) are configured to be operated and stowed easily. Handheld devices provide the convenience of being portable for users throughout a work environment, such as a warehouse, and thereafter being returned to an appropriate base station—sometimes also referred to as a docking station—for charging, data transfer, or general stowage. In some cases, the use of handheld devices in vehicles, such as forklifts, may also be useful. For example, a base station may be secured to a work vehicle for transport to different job sites, with a reader being equipped to be removed from the base station, and the vehicle, for various tasks, before being returned to the base station for charging, etc.

Despite these advantages, some conventional arrangements for handheld devices and base stations may exhibit certain problems. For example, although it may be useful to mount base stations in a variety of configurations, conventional designs may not result in a particularly secure connection between a base station and a handheld device in all desired orientations. Further, some conventional designs may not appropriately secure handheld devices against inadvertent removal from a base station due to vibrations, impacts, or other similar events.

As another example, although it may be useful to establish electrical connections between readers and base stations for electrical charging or other interchanges, conventional designs can be subject to excessive wear, including due to sliding friction between electrical contacts. This wear can result in friction-based mechanical degradation, corrosion, or other detrimental effects, thereby negatively affect the charging and data-transfer capabilities of a particular electrical connection. These effects, in turn, can lead to corresponding negative results for overall system performance, including relative to battery life and speed of electrical charging or data transfer.

Embodiments of the technology can address these or other issues, including by providing base station systems that are adapted to securely hold handheld devices in a variety of orientations or to provide electrical charging or data interfaces that operate with reduced wear per attachment cycle (i.e., per seating of a handheld device on a base station for charging or data transfer).

In some embodiments, a latch system for a base station and a handheld device can be selectively adjusted to operate in different latching configurations, to hold handheld devices more or less securely to the base station depending on the particular context (e.g., setting and orientation) in which the base station is to be installed or used. For example, some embodiments can be manually (or otherwise) adjustable to secure a handheld device with maximum latching, in a first configuration, to secure a handheld device with an intermediate degree of latching, in a second configuration, and to secure a handheld device with relatively minimal (e.g., no) latching, in a third configuration. Thus, for example, some embodiments can be selectively adjusted in order to appropriately receive and secure handheld devices to a base station on a horizontal surface (e.g., a table top), on a vertical or other non-horizontal surface (e.g., a wall), and on a vertical or other surface that may be subject to impacts or vibration (e.g., a frame of a forklift or other vehicle).

In some embodiments, an electronic interface on a base station for charging of or data transfer to a handheld device can be configured to include multiple hinging members, as may help to provide rolling frictional engagement with a corresponding interface on the handheld device while reducing (e.g., eliminating) sliding contact. For example, an electronic contact on a base station can be supported as part of a double-hinged system, which can be caused to pivot about at least two distinct axes by the docking of a handheld device on the base station. Thus, conductive engagement with a handheld device can be obtained with substantially reduced (e.g., zero) sliding engagement of the electronic contact of the base station with an electrical contact on the handheld device. In particular, in some embodiments, a first hinge member can be rotatably supported on a base station, and an electrical contact can be rotatably supported on a second hinge member that is itself rotatably supported on the first hinge member. With this arrangement, as a reader is docked on the base station, the reader can rotate the first and second hinge members, in turn, resulting in rolling, rather than sliding, engagement (e.g., contact) for electrical communication between the reader and the base station. Thus, for example, appropriate engagement can be obtained between electronic contacts on a base station and on a handheld device without the wear associated with the sliding friction that may be characteristic of conventional systems.

In some embodiments, including as detailed below, movable parts of an adjustable latch system can be installed in a base station and can move relative to other components of the base station to secure an associated handheld device. This may be particularly useful in some cases, because the space available for movable components within a base station may be larger or more easily adapted than the space available within a handheld device. In some embodiments, however, movable parts of an adjustable latch system can be installed on a handheld device and can move relative to other components of the handheld device to secure the handheld device to an associated base station. Further, similarly reversed configurations are also possible relative to multi-hinge electrical connections. Correspondingly, unless otherwise specified, examples presented below as having a first set of components on a handheld device and a second set of components in a base station are intended also to disclose a corresponding reversed configuration, in which the first set of components (or a similar other arrangement) is installed on a base station and the second set of components (or a similar other arrangement) is installed on a handheld device. Accordingly, for example, discussion below of movable latches or electrical connections within a housing of a base station can generally apply equally, mutatis mutandis, to a similar installation of movable latches or electrical connections within a housing of a handheld device.

Figure 2:
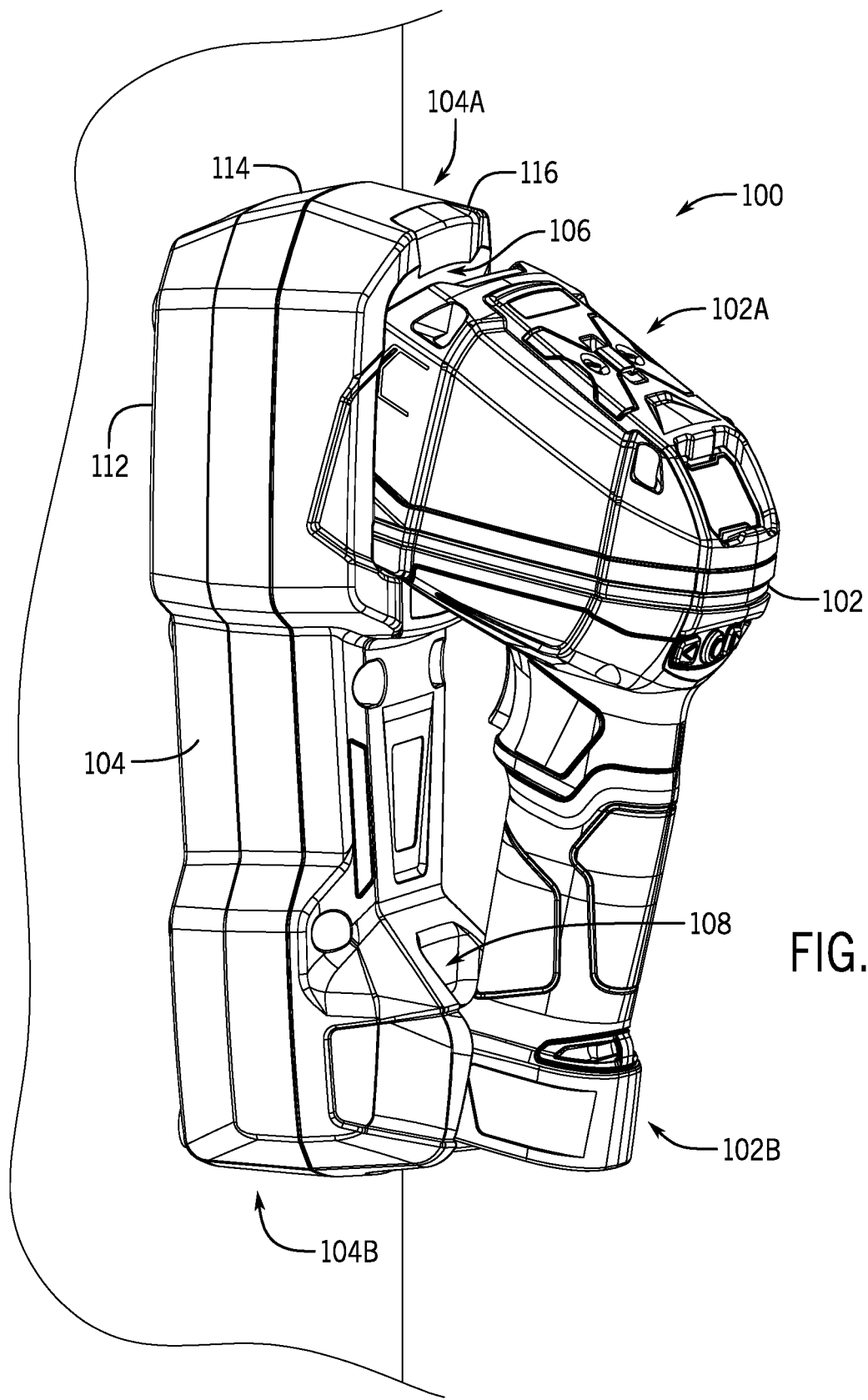
FIG. 2 illustrates the handheld reader and the base station of FIG. 1 in a second mounting orientation.

FIGS. 1 and 2 illustrate an example machine vision system 100 according to an embodiment of the technology, including a handheld device configured as a handheld reader 102 and a corresponding base station 104. In the illustrated example, the reader 102 is configured to scan and decode barcodes and can include corresponding internal systems (not shown), including light sources, imaging devices, aimers, machine vision engines (e.g., special or general purpose processor devices with associated computer-readable instructions), and so on. Further, the reader 102 is illustrated as a pistol-grip style reader, with a head end 102A configured for scanning, a base end 102B with a grip, and a manually operable trigger. Correspondingly, the base station 104 includes a head end 104A to receive the head end 102A of the reader 102 and a base end 104B to receive the base end 102B of the reader 102. In other embodiments, however, other configurations are possible, including readers and other handheld devices that are configured for other types of tasks (e.g., imaging and analysis of objects or other types of symbols) or exhibit other form factors and correspondingly varied base stations.

Generally, the base station 104 can retain the reader 102, when the reader 102 is engaged with (i.e., docked on) the base station 104 as shown in FIGS. 1 and 2, both to ensure that the reader 102 remains in an accessible location and orientation and to provide charging, data transfer, or other electrical communication to the reader 102, as appropriate. In particular, the head end 102A of the reader 102 seats within a head-end well 106 of the base station 104 and the base end 102B of the reader 102 seats within a base-end well 108 of the base station 104.

In different embodiments, wells or other features to receive a docked reader can exhibit a variety of different configurations, including configurations with guide features, and configurations with fully enclosed or partially enclosed perimeters. In the illustrated embodiment, for example, referring also to FIG. 3, each of the wells 106, 108 exhibits a respective perimeter wall that laterally surrounds the head or base end 102A, 102B of the reader 102 on three sides. Further, the head-end well 106 angles downwards (i.e., further into the base station 104) from a perspective moving towards the base-end well 108, as may help to guide a reader into a securely seated orientation, and also includes lateral guide features configured as protrusions 110 that extend the full depth of the well 106. Thus, for example, a user can easily seat the reader 102 into the wells 106, 108, from a variety of starting configurations, with the perimeter walls of the wells 106, 108 and the protrusions 110 helping to reliably guide the reader 102 into an appropriate docking orientation, including when the reader 102 is seated onto the base station 104 using only the force of the weight of the reader 102 itself. However, in other embodiments, a variety of other well configurations, including other shapes and extents of perimeter walls and of guide features are possible.

In general, in different embodiments, different materials and overall profiles are possible for a base station. For example, in the illustrated example, the base station 104 is largely formed from insulating (e.g., plastic) material, with a housing 112 that includes a base 114 and a cover 116, as is the housing of the reader 102. In other embodiments, however, other configurations are possible.

As noted above, it may be useful for a base station to be installed in a variety of orientations and in a variety of settings, including horizontal orientations (e.g., as in FIG. 1), vertical orientations (e.g., as in FIG. 2), or others, and in settings that may be subject to vibrations, impacts, or other shocks. Correspondingly, as partially shown in FIG. 3, the base station 104 includes a latch system 120 that can be selectively disposed in a variety of different configurations, in order to selectively retain the reader 102 on the base station 104 with an adjustable degree of security.

In particular, and as further discussed below, the latch system 120 as illustrated is a multi-point latch system that includes a symmetrical translating latch 122 for the head-end well 106 and symmetrical rotating latch 124 for the base-end well 106. In other embodiments, however, other configurations are possible, including non-symmetrical configurations and configurations in which different types of movement are possible (e.g., rotating latches for a head-end well and translating latches for a base-end well). Further, although only two orientations of the machine vision system 100 are shown in FIGS. 1 and 2, the multi-point latch system 120 can secure the reader 102 to the base station 104 in a variety of other orientations. Indeed, in some configurations, the latch system 120 may hold the reader 102 sufficiently securely that reader 102 can be held in place even when disposed below the base station 104 (e.g., with the system 100 inverted about horizontal, relative to FIG. 1, so that gravity urges the reader 102 to fall out of the base station 104).

In some embodiments, a latch system can be adjustable from outside of a base station, to place the latch system in different latching configurations and thereby selectively secure a reader to the base station to different degrees. In different embodiments, a latch system can be adjusted manually or automatically, and can be adjusted mechanically, electronically, magnetically, or otherwise (e.g., using a combination of these approaches).

Figure 4:
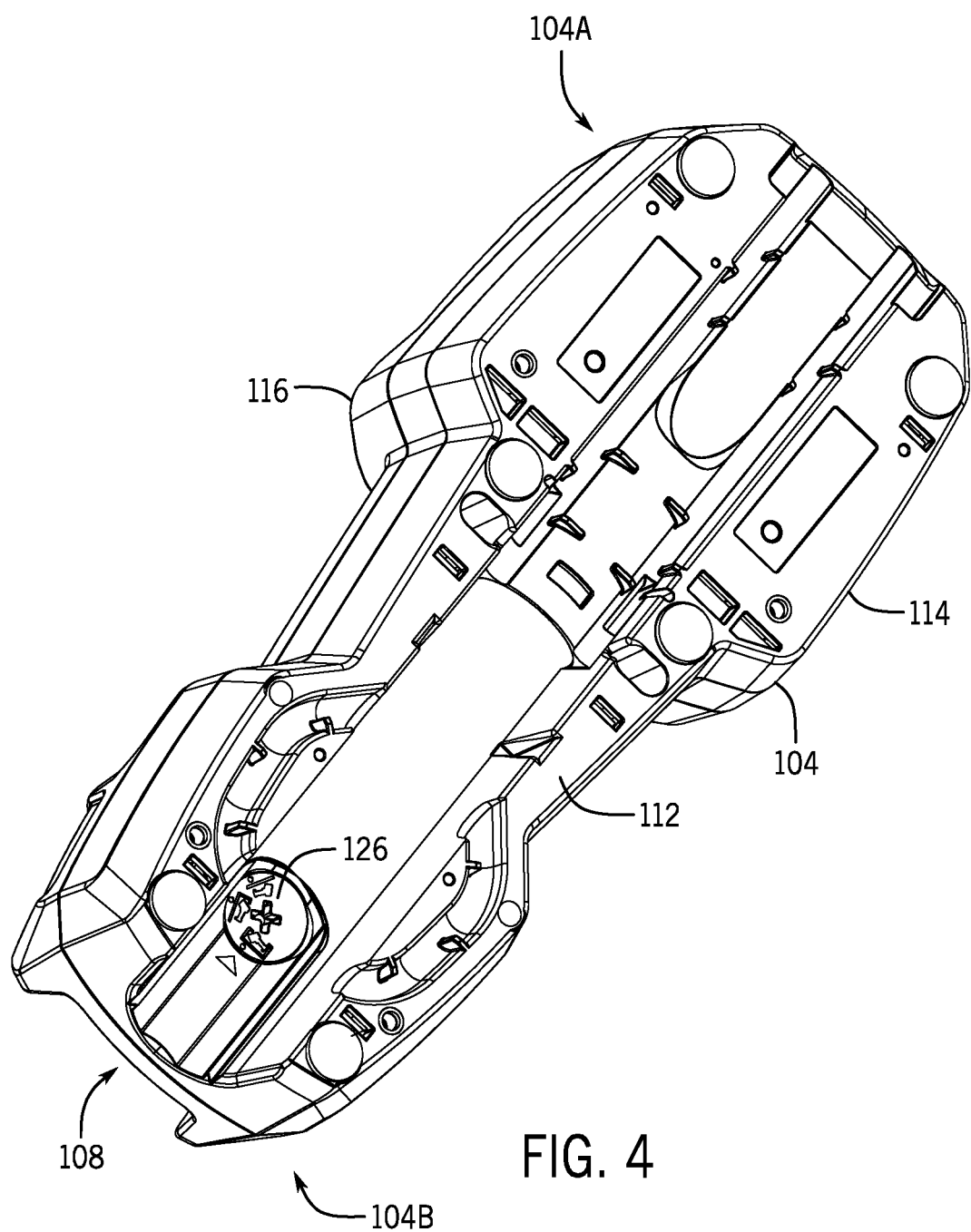
FIG. 4 is a bottom view of the base station of FIG. 1, showing a mode selector of the multi-point latch system of FIG. 3.

In the illustrated configuration, the latch system 120 is mechanically, manually adjustable from outside of the base station 104 in order to adjust the latch system 120 between three different latching configurations (as further discussed below). In particular, as shown in FIG. 4, a mode selector is configured as a rotatable adjustment body 126 that is exposed for engagement at the bottom of the base end 104B of the base station 104. In particular, the adjustment body 126 includes a Phillips-head engagement feature, although other features are possible, including knobs or tabs for finger-engagement, engagement features for other tools, and so on.

Figure 7:
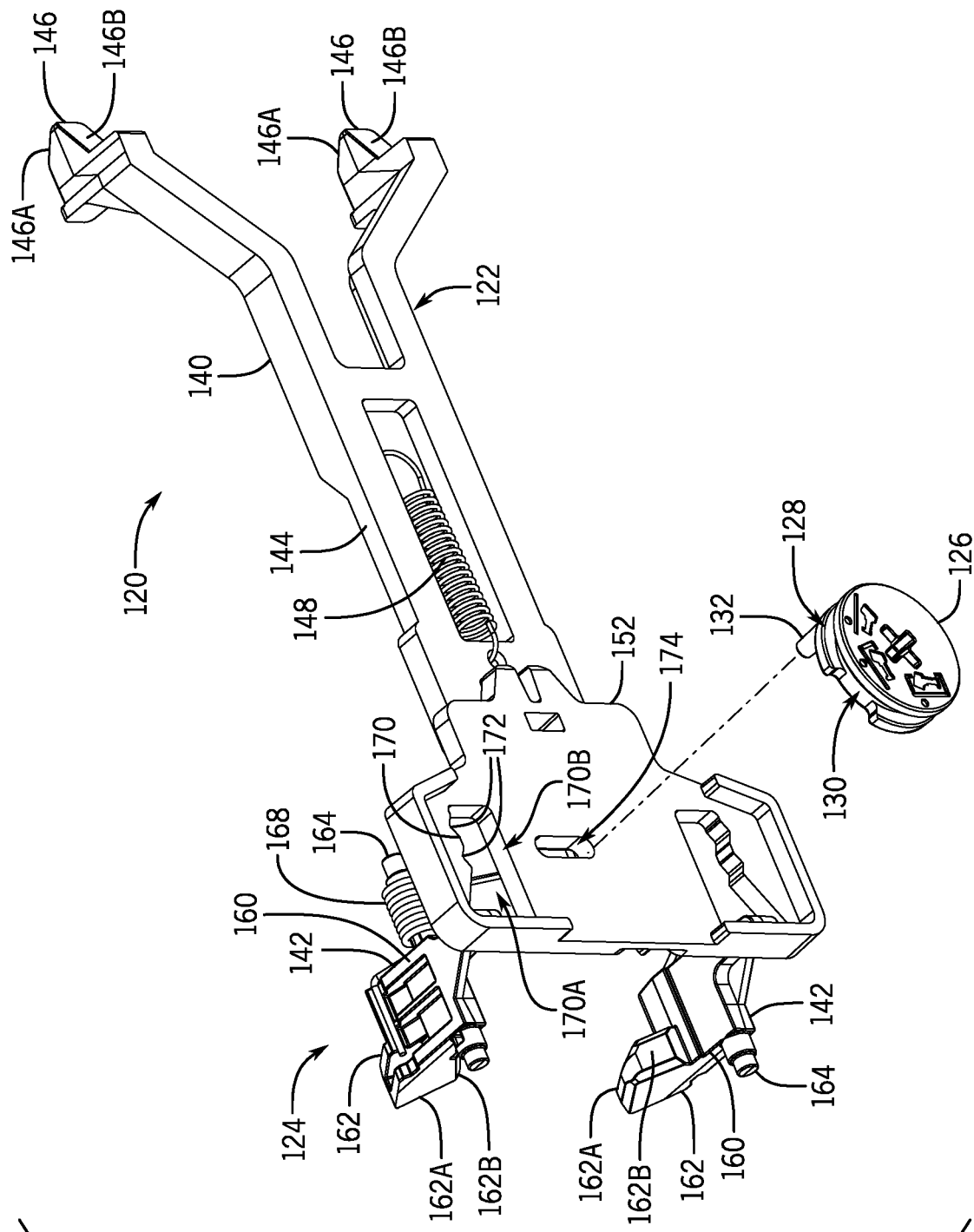
FIG. 7 is bottom partially exploded view of the multi-point latch system of FIG. 3, including the mode selector of FIG. 4.

As further shown in FIG. 7, the adjustment body 126 is generally cylindrical and includes an annular channel 128 with an entrance gap 130, and a cam member formed as a pin 132. With easy installation permitted via the entrance gap 130, the annular channel 128 can engage an inner rail or other protrusion on the base station 104 (see, e.g., FIG. 5) in order to be rotatably secured to the base 114 of the housing 112, with the pin 132 extending toward the interior of the housing 112 to engage a control body, as further discussed below.

Figure 5:
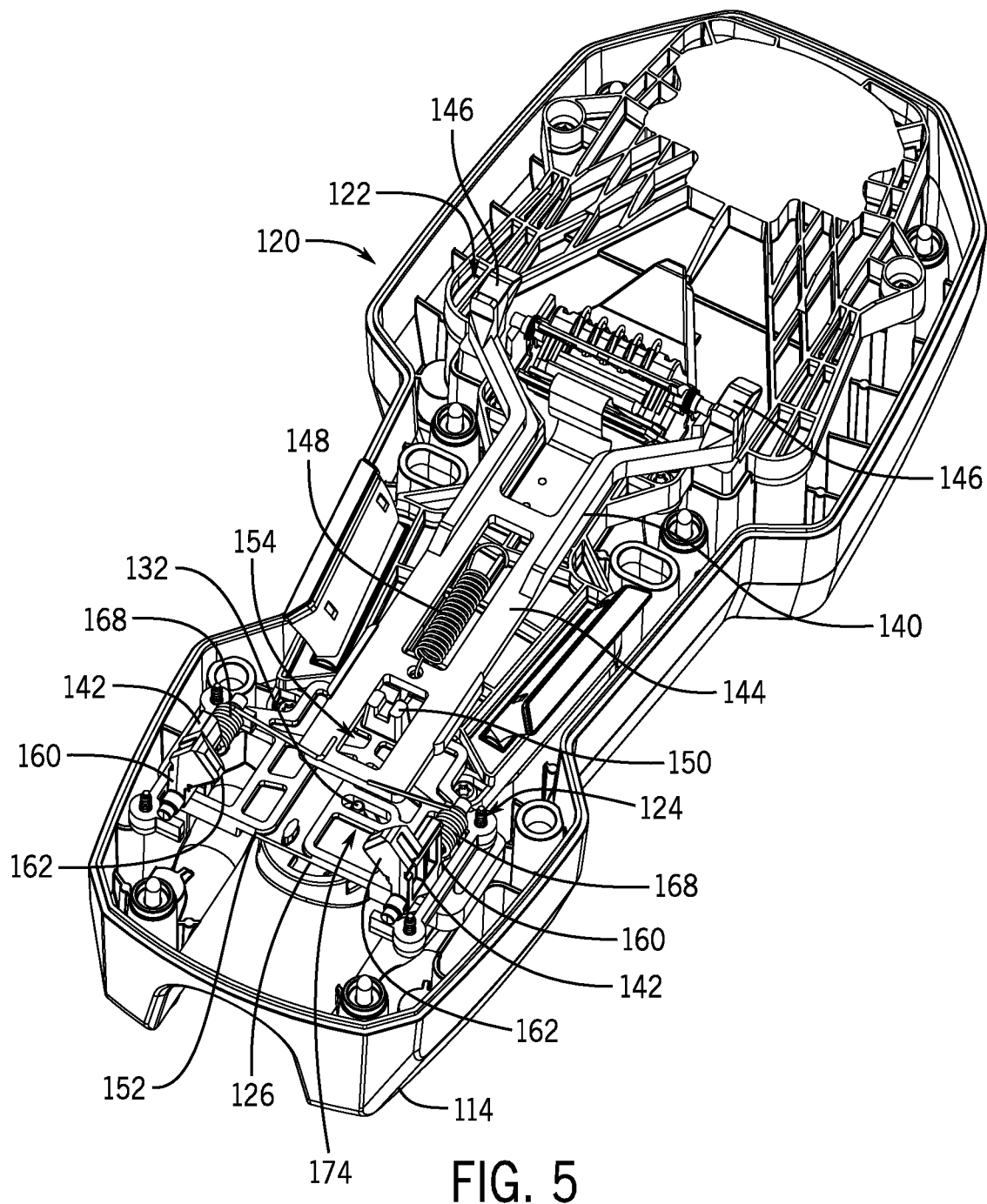
FIG. 5 is a top view of the base station of FIG. 1. with a top cover removed to further show the multi-point latch system of FIG. 3.
Figure 6:
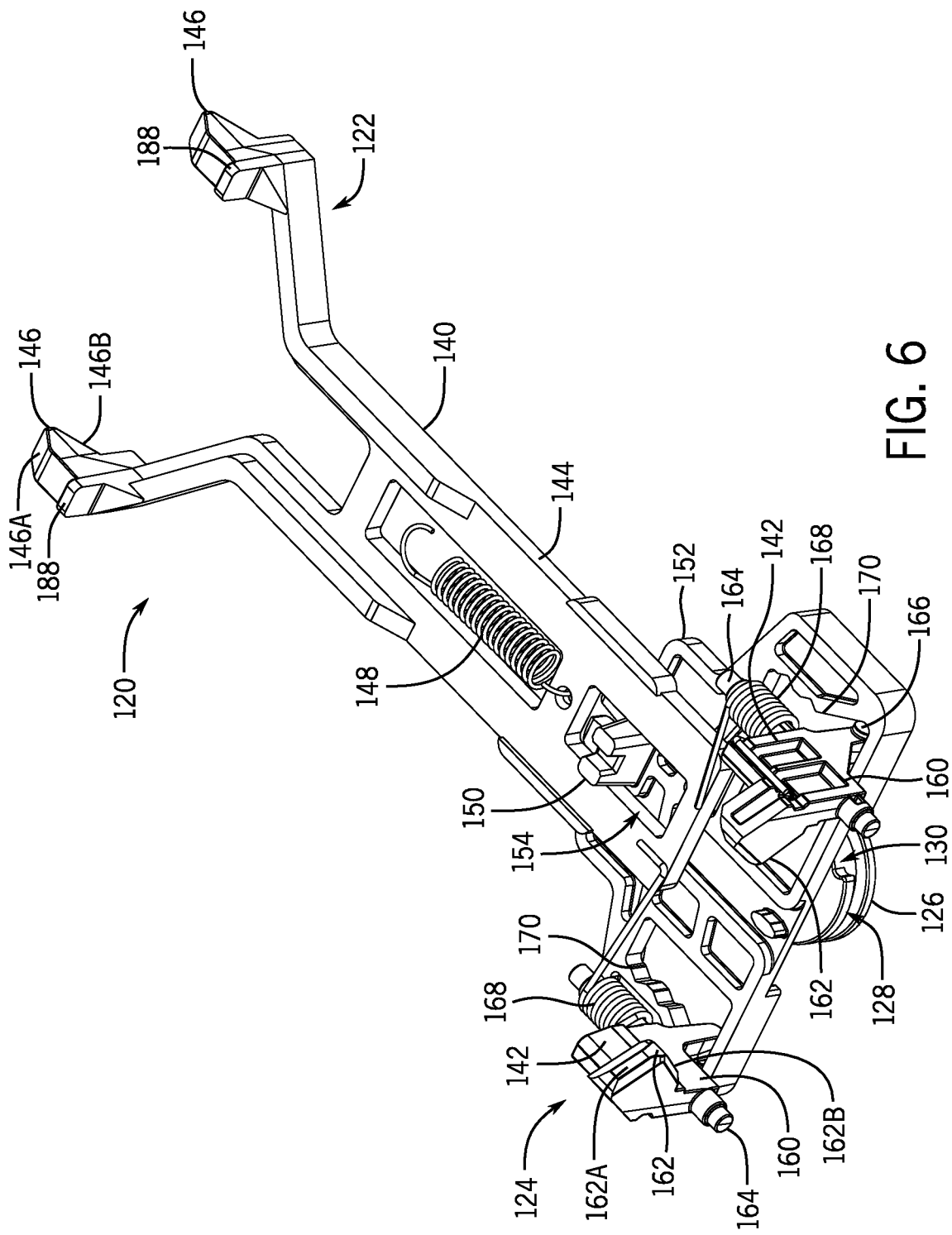
FIG. 6 is a top view of the multi-point latch system of FIG. 3 in isolation.

FIGS. 5 through 7 illustrate further details of the latch system 120. Generally, a latch system according to embodiments of the technology can include at least two latches that can be selectively activated or deactivated (e.g., selectively extended or retracted) to individually or collectively engage (or not engage) a docked device at different locations on the device. For example, as also discussed above, the latch system 120 includes the latch 122 to engage the head end 102A of the reader 102 (see FIG. 1) and the latch 124 to engage the base end 102B of the reader 102 (see FIG. 1).

More particularly, in the illustrated example, the latch 122 is formed as a unitary latch member 140 that is slidably secured within the housing 112 (e.g., slidably held between features of the base 114 and the cover 116) and the latch 124 includes a set of two latch members 142 that are separately rotatably secured within the housing 112 (e.g., at a pinned connection). Further, the translational (sliding) direction of the latch member 140 extends in parallel with the elongate direction of the housing 112 and with the axes of rotation of the latch members 142. Accordingly, when in extended orientations, as further discussed below, the latch members 140, 142 can engage the reader 102 from different directions and with different types of movement (e.g., translation vs. rotation) as well as at different locations. In some cases, this may lead to particularly secure retention of a reader, including for non-horizontal installations, in the event of vibrations or impacts, and so on.

In other embodiments, however, other configurations are possible. For example, whereas each of the latches 122, 124 is symmetrical in the latch system 120, other latch systems may have non-symmetrical latches. In some embodiments, latches may be configured to engage a reader at different locations that shown (e.g., at different locations within wells of a base station) or by moving differently between extended and retracted orientations than is shown for the latches 122, 124. Further, although the latch 122 is illustrated with a translational latch arrangement and the latch 124 is illustrated with a rotational latch arrangement, other arrangements are possible. For example, some latch systems may engage a head portion of a reader with a rotational movement or from lateral sides of the reader (e.g., similarly to the latch 124) or may engage a base portion of a reader with translational movement (e.g., similarly to the latch 122) or from non-lateral directions. Also, as generally noted above, some embodiments may include latch systems (e.g., similar to the system 120) with moving components that are installed in a handheld device, rather than (or in addition to) in a base station.

Figure 3:
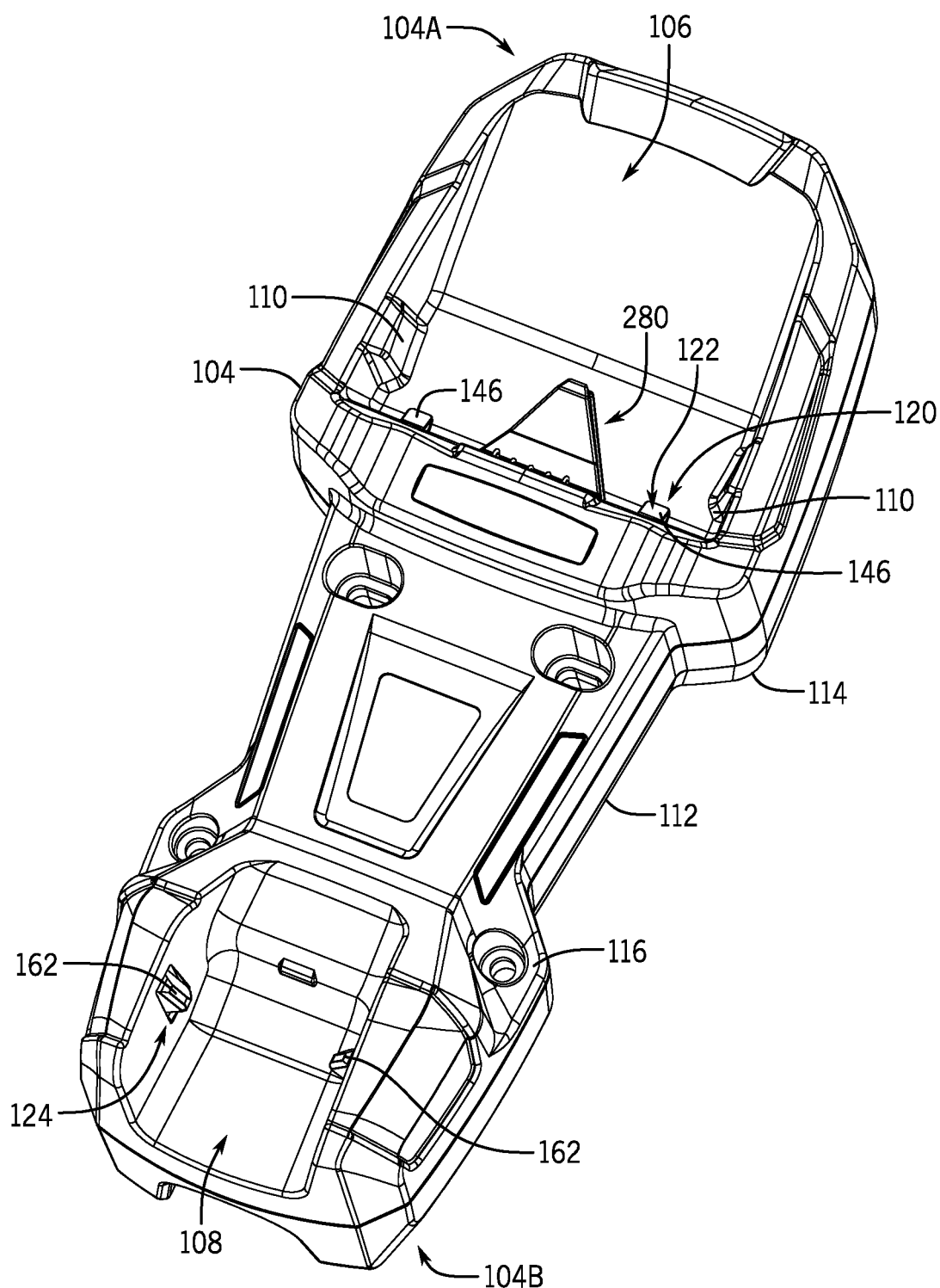
FIG. 3 is a top view of the base station of FIG. 1, showing exposed latch portions of a multi-point latch system of the base station.

Referring in particular to FIGS. 6 and 7, the latch member 140 is formed as a unitary elongate component with a symmetrical body portion 144 and set of symmetrically disposed latch portions 146. A biasing member, such as a coil spring 148, can be secured to the latch member 140 and to the housing 112, so that the latch member 140 is generally biased towards the latch portions 146. Accordingly, for example, as shown in FIG. 3, the latch portions 146 are biased to extend to a maximum degree out of the housing 112 within the head-end well 106, with the biasing force increasing as the latch member 140 is moved from the extended configuration (see FIG. 3) toward a retracted configuration (i.e., as the latch portions 146 are moved to extend less far into the head-end well 106, to receive or release the reader 102).

In the illustrated embodiment, as discussed above, two latch portions are provided (i.e., the latch portions 146), symmetrically disposed on a latch member (i.e., the latch member 140). This arrangement can be useful, for example, to provide a spatially balanced engagement of a handheld device and redundancy in the case of damage or wear. In other embodiments, however, other configurations are possible, including configurations with a different number of latch portions, non-symmetrical or otherwise differently arranged latch portions, and so on.

In some embodiments, features on a latch member can provide mechanical stops to limit overall movement within a housing. For example, on the latch member 140, laterally extending struts, the outwardly angled arms that support the latch portions 146, protrusions 188 on the angled arms near the latch portions 146 (see FIG. 6) or other features can be configured to contact other structures within the housing 112 to limit overall movement of the latch member 140. In some embodiments, as further discussed below, the range of permitted movement of a latch member can be adjustably limited, such as via a protrusion 150 on a slidable control body 152 that extends through a slot 154 on the latch member 140. In this regard, although the slot 154 is configured as a closed slot and the protrusion 150 is configured to engage an end wall of the slot 154 in some control orientations, other configurations are possible (e.g., open-sided slots, slots with contact features other than at the ends thereof, and so on).

Figure 8:
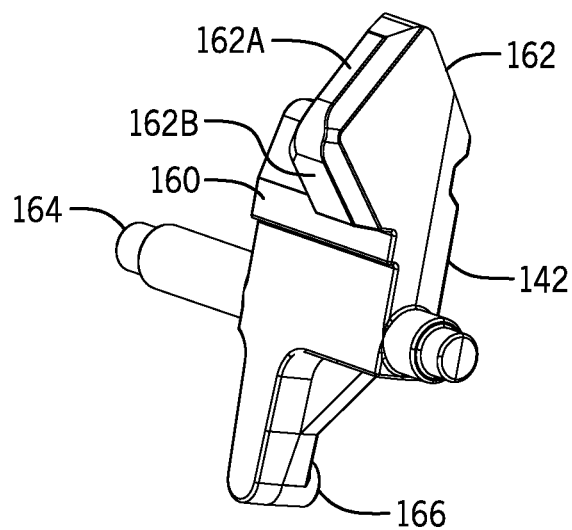
FIG. 8 illustrates a latch of the multi-point latch system of FIG. 3.

Referring now to FIG. 8 in particular, each of the latch members 142 is formed as a unitary component with a body portion 160 and a latch portion 162. The body portion 160 further includes a pin 164 to rotatably secure the latch member 142 to the housing 112 (see FIG. 6) and a control member. In particular, the illustrated control member is formed as a protrusion 166 disposed opposite the pin 164 from the latch portion 162 and extending in an opposite direction relative to the pin 164 than the latch portion 162, although other configurations are possible.

As shown in FIGS. 5 and 6 in particular, when the latch members 142 are rotationally installed in the housing 112, the latch portions 162 extend from opposing directions, laterally into the base-end well 108 (see FIG. 5). In contrast, the protrusions 166 extend laterally away from the base-end well 108. In the illustrated example, the latch members 142 are substantially identical (i.e., identical within relevant manufacturing tolerances) mirrored pairs as well as being symmetrically installed, although other configurations are possible, including configurations with different numbers of latch members, with non-symmetrical or other arrangements, and so on.

As shown in FIGS. 6 and 7 in particular, a biasing member, such as a torsion spring 168, can be secured to each of the latch members 142 and to the housing 112, so that the latch members 142 are generally biased to rotate the latch portions 162 into the base-end well 108. Accordingly, for example, as shown in FIG. 3, the latch portions 162 are biased to extend to a maximum degree out of the housing 112 within the base-end well 108, with the biasing force increasing as the latch members 142 are moved from the extended configuration (see FIG. 3) toward a retracted configuration (i.e., as the latch portions 162 are moved to extend less far into the base-end well 108, to receive or release the reader 102).

As also noted above, in some embodiments, features on a latch member can provide mechanical stops to limit overall movement within a housing. For example, on the latch members 142, parts of the body portions 160 can be configured to contact other structures within the housing 112 to limit overall movement of the latch member 142. In some embodiments, as further discussed below, the range of permitted movement of a latch member can be adjustably limited, such as via selective modes of engagement of the protrusions 166 by the control body 152.

In the illustrated embodiment, the latch members 142 are configured to generally move independently of each other and of the latch member 140. Accordingly, for example, movement of any one of the latch members 140, 142 between extended and retracted configurations does not necessarily result in movement of any of the others of the latch members 140, 142 in a similar matter. However, as alluded to above and further discussed below, movement of the control body 152 can in some cases cause simultaneous movement of two or more of the latch members 140, 142. Further, some embodiments can be configured in which movement of a particular latch member is linked to (e.g., causes or is caused by) movement of another latch member.

Further in this regard, a control body can generally be configured to selectively move any number of latches, individually or collectively, between extended and retracted orientations, and thereby to place a particular latch system into any one of a plurality of latching configurations. In this regard, a control body can be configured to rotate, translate, electrically or magnetically activate, or otherwise engage a latch in a variety of ways as the control body is actuated (e.g., moved to different control orientations) in order to move the latch to a particular latching configuration.

Figure 9:
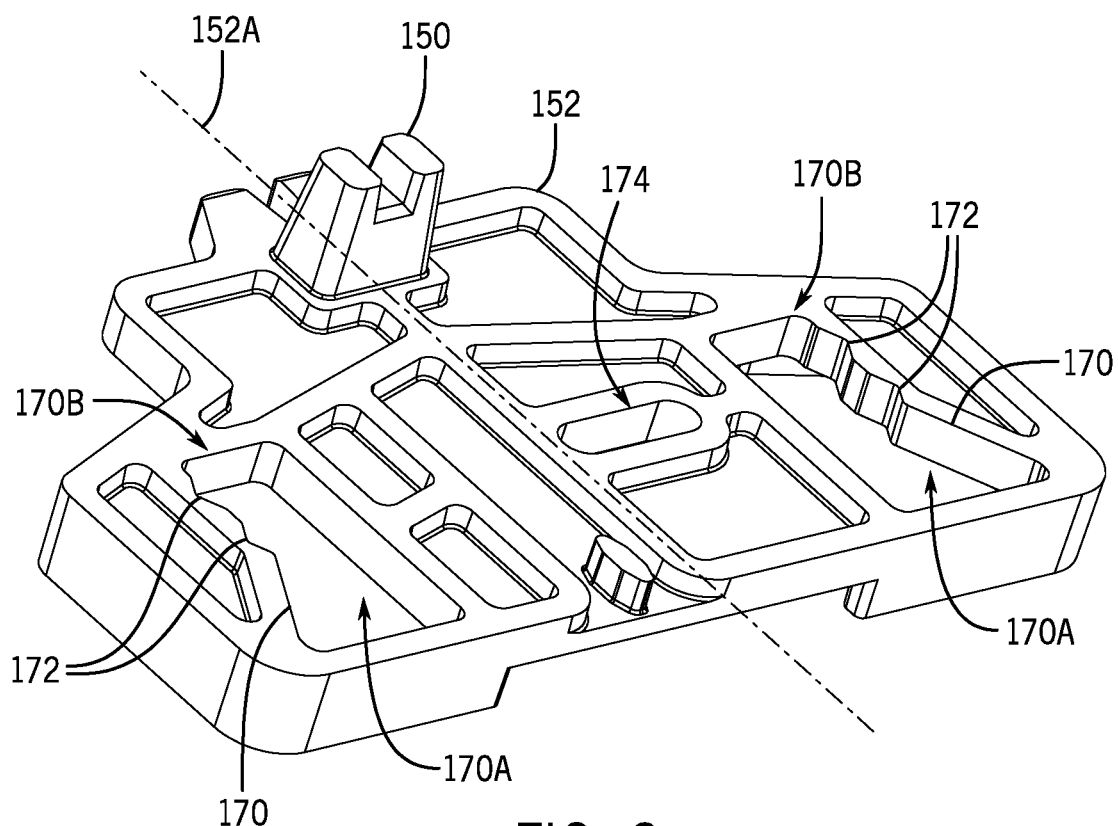
FIG. 9 illustrates a control body of the multi-point latch system of FIG. 3.

In the illustrated embodiment, the control body 152 is configured to translate within the housing 112 to selectively and individually move the latches 122, 124 between extended configurations, in which the latches 122, 124, respectively, (and the latch members 140, 142, individually) can secure the reader 102 to the base station 104, and retracted configurations, in which the latches 122, 124, respectively, do not secure the reader 102 to the base station 104 (or at least secure the reader 102 to a lesser degree). In particular, as illustrated in FIG. 9, the control body 152 is formed as a unitary component that is configured to be slidably moved within the housing 112 (see FIG. 6). As also noted above, the control body 152 includes the protrusion 150 that extends through the slot 154 on the latch member 140 when the latch system 120 is assembled (although a reversed or other similar configuration is possible).

To further control the latching configuration of the latch system 120, the control body also includes a set of control profiles 170. In general, a control profile on a control body can be configured to engage a control member on a latch to selectively move the latch between extended and retracted orientations depending on the current orientation of the control body. In this regard, because the latch members 142 are symmetrically arranged and generally configured to operate in tandem, the control profiles 170 are symmetrically contoured and arranged on the control body 152, relative to the translational axis 152A of the control body 152. Accordingly, the control profiles 170 can symmetrically engage and actuate the latch members 142 as the control body 152 is moved. In other embodiments, however, other configurations are possible, including non-symmetrical configurations and configurations in which control members are configured to separately actuate different latch members of a particular latch for independent movement thereof.

In general, a variety of geometries can be used for a control profile, depending on the desired corresponding movement of a latch member. In particular, each of the control profiles 170 is configured to engage a respective one of the protrusions 166 on the latch members 142 and is obliquely angled relative to the sliding direction of the control body 152, extending from a wider portion 170A to a narrower portion 170B relative to a sliding direction of the control member (e.g., along the translational axis 152A). Accordingly, as further discussed below, as movement of the control body 152 moves the control profiles 170 relative to the protrusions 166, the control profiles 170 can move the protrusions 166 to different distances from a reference plane, in a direction perpendicular to the direction of movement the control body 152 (e.g., perpendicular to the axis 152A). Due to the rotational mounting of the latch members 142, via the pins 164, such movement of the protrusions 166 can rotate the latch members 142 by different degrees and in opposite directions relative to each other, to thereby selectively and simultaneously move the latch members 142 between retracted and extended configurations.

In some embodiments, other features can be provided, including features to help secure a latch member in a particular orientation. For example, as also shown in FIG. 9, each of the control profiles 170 includes a set of indents 172 along the narrower portion 170B thereof. As further discussed below, the protrusions 166 can seat within these indents 172 to help secure the control body 152 against inadvertent sliding movement away from a current control orientation (and corresponding latching configuration), as well as to provide tactile or auditory feedback regarding the disposition of the latch members 142 in a particular latching orientation.

Generally, a control body can be configured to be moved to different control orientations in a variety of different ways, in order to selectively dispose associated latches in extended or retracted configurations and thereby place a latch system in general into a particular latching configuration. As also noted above, the control body 152 is configured to be slidably moved between different control orientations by the adjustment body 126. As shown in FIG. 7 in particular, the pin 132 on the adjustment body 126 is configured to align with a slot 174 on the control body 152, so that the pin 132 extends into the slot 174 when the housing 112 and the latch system 120 are fully assembled (see also FIG. 5). Accordingly, via a camming action, rotation of the adjustment body 126 from outside of the housing 112 can translate the control body 152 within the housing 112 in order to dispose the latches 122, 124 in different orientations.

In other embodiments, other arrangements can be used to allow selective adjustment of a control body. For example, some control bodies can be configured to extend partly outside of a housing or to be otherwise directly accessible from outside a housing, so that a user can directly move a control body to adjust a latch system between different latching configurations. As another example, a variety of other camming arrangements can be used. Further, as also noted above, some control bodies may be configured to rotate (e.g., rather than translate) between different control orientations to move latches between different latching configurations. Correspondingly, some adjustment members may be configured to be rotated to rotate a control body, or may be configured to be translated in order to rotate the control body (e.g., in a camming arrangement that is reversed from that shown for the control body 152 and the adjustment body 126).

In different embodiments, a variety of different combinations of latching configurations are possible, as can be selectively set using a variety of different control bodies. In the illustrated embodiment, the latch system 120 is configured to provide three distinct latching configurations: a first latching configuration, in which the first and second latches 122, 124 are in the extended orientation (see FIGS. 10A through 10C), a second latching configuration, in which the first latch 122 is in the extended orientation and the second latch 124 is in the retracted orientation (see FIGS. 11A through 11C), and a third latching configuration, in which the first and second latches 122, 124 are in the retracted orientation (see FIGS. 12A through 12C). Thus, for example, the latch system 120 can provide substantial (e.g., a maximum degree of) retention of the reader 102 when in the first latching configuration, less substantial (e.g., an intermediate degree of) retention of the reader 102 when in the second latching configuration, and minimal (e.g., zero) retention of the reader 102 when in the third latching configuration.

Correspondingly, in some contexts, the first latching configuration can be useful for installations in which the reader 102 may be subject to vibrations or impacts, the second latching configuration can be useful for vertically mounted (see, e.g., FIG. 2) and stable (e.g., vibration-free) installations, and the third latching configuration can be useful for horizontally mounted (see, e.g., FIG. 1) and stable installations. Further in this regard, the adjustment body 126 exhibits three latching-strength icons, as shown in FIG. 4 in particular, that can guide a user in moving the adjustment body 126 to select an appropriate configuration depending on the particular installation context. In other embodiments, however, different numbers or types of latching configurations can be provided, one or more available latching configurations may be particularly well suited to one or more contexts other than those expressly enumerated above, or different latching-strength icons or indicators can be provided on an adjustment body or at other locations.

In some embodiments, differences in retention strength for different latching configurations can provide additional benefits for base station and handheld devices (or other similar systems). For example, in latching configurations with lower degrees of retention, it may be easier for users to remove a handheld device from a base station, which may correspondingly improve user experience as well as potentially increase the longevity of the system as a whole. Thus, for example, some embodiments can beneficially allow users to appropriately customize latch systems so as not to provide excess latching retention beyond what is needed for a particular installed context.

Figure 10B:
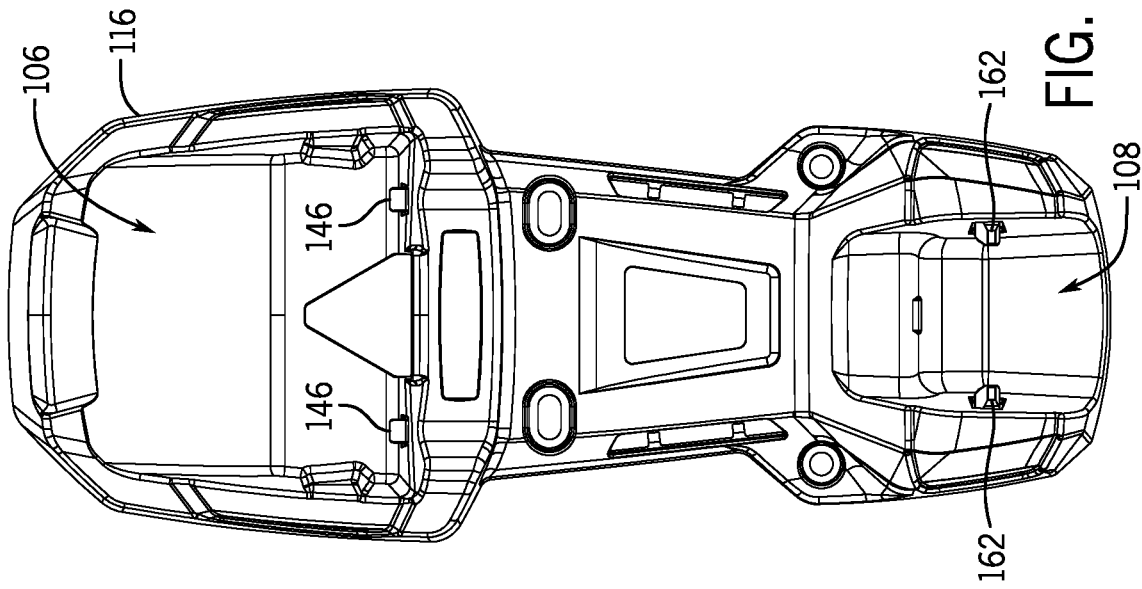
FIGS. 10A and 10B are bottom and top view, respectively, of the multi-point latch system and the base cover of the base station of FIG. 1 in a first latching configuration.
Figure 10A:
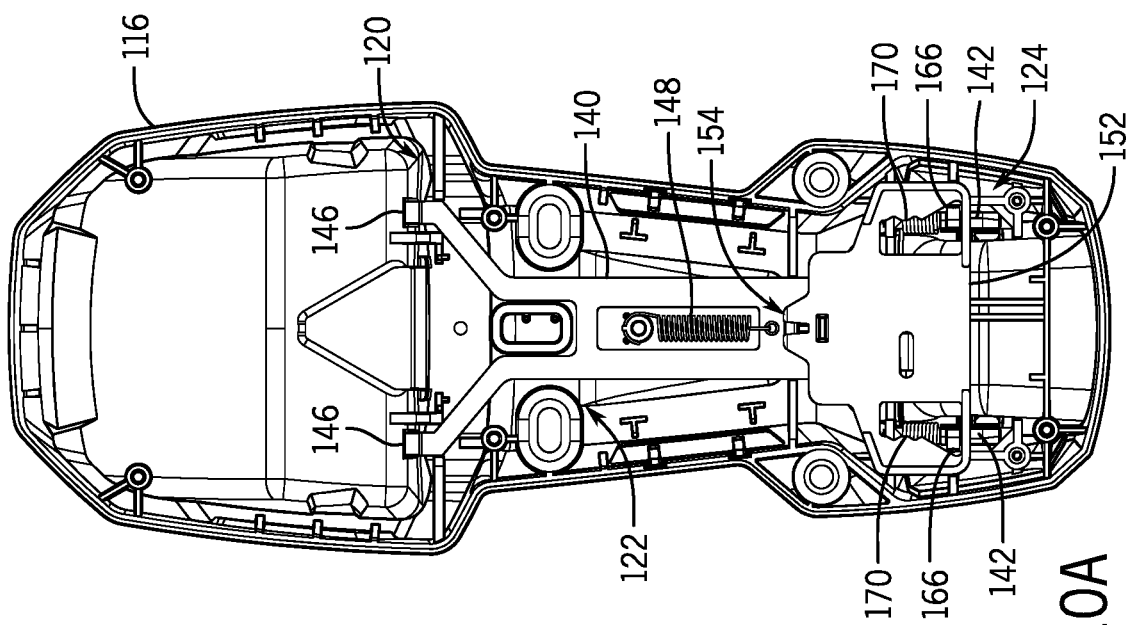
Figure 10C:
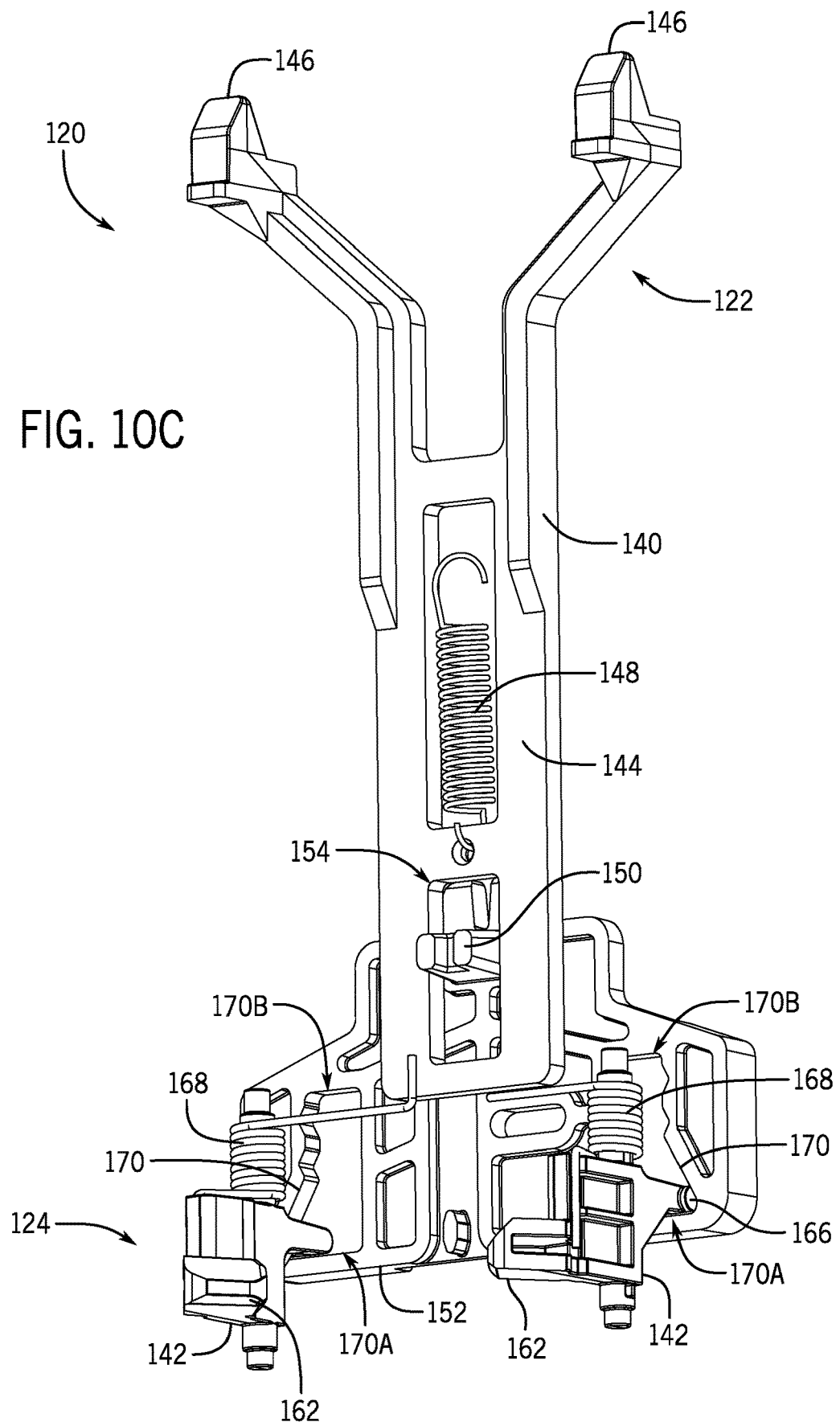
FIG. 10C is an isolated view of the multi-point latch system of FIG. 3 in the first latching configuration.

Referring in particular to FIGS. 10A through 10C, when the latch system 120 is in the first (highest retention) latching configuration the protrusion 150 (see FIG. 10C) is seated freely within the slot 154, spaced well apart from the end wall thereof. Accordingly, translation of the latch member 140 is generally not inhibited by the control member 152 and the biasing force of the spring 148 causes the latch portions 146 of the latch member 140 to extend fully into the head-end well 106 (see FIG. 10B) to engage the docked reader 102 (see also FIG. 13). Further, the control profiles 170 are aligned so that the protrusion 166 on the latch members 142 are seated in the wider portions 170A thereof. Accordingly, the control profiles 170 generally do not inhibit the latch portions 162 from extending into the base-end well 108 to engage the reader 102 (see also FIG. 14). Accordingly, as the reader 102 is seated on the base station 104, the reader 102 can thus first displace the latch members 140, 142 against the bias of the springs 148, 168 before receiving the latch portions 146, 162 into corresponding recesses 176, 178 in the reader 102 (see FIGS. 13 and 14) to be firmly secured to the base station 104. In some cases, the engagement force of the latch members 140, 142 in this configuration can be sufficient to hold the reader 102 even against the full force of gravity, with the base station 104 inverted from the configuration shown in FIG. 1, although other arrangements are possible.

Figure 11B:
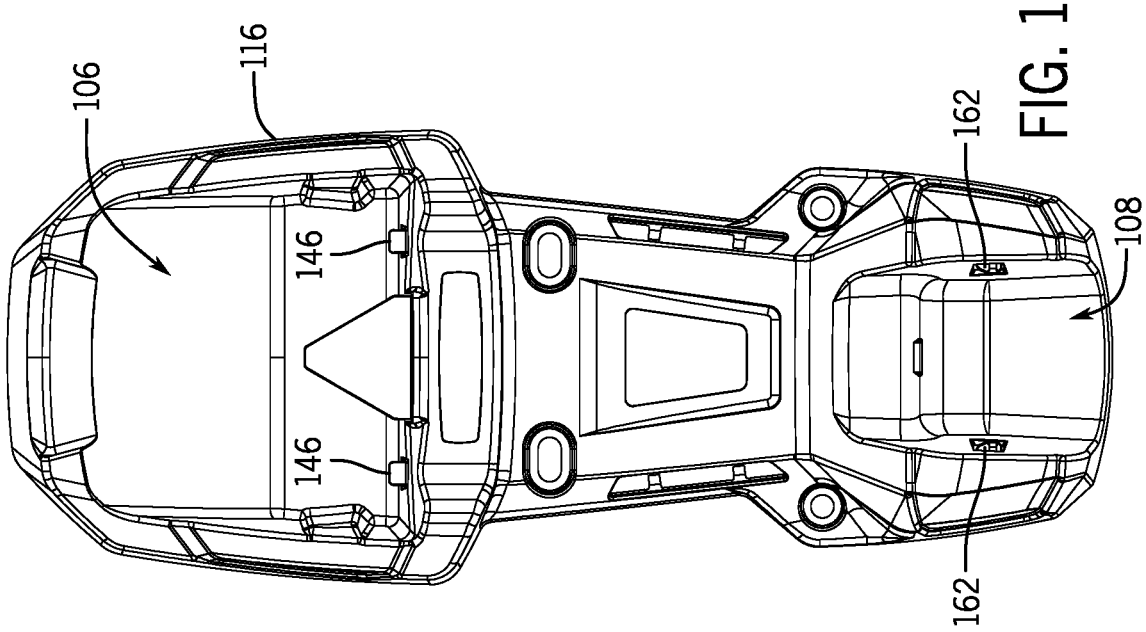
FIGS. 11A and 11B are bottom and top view, respectively, of the multi-point latch system and the base cover of the base station of FIG. 1 in a second latching configuration.
Figure 11A:
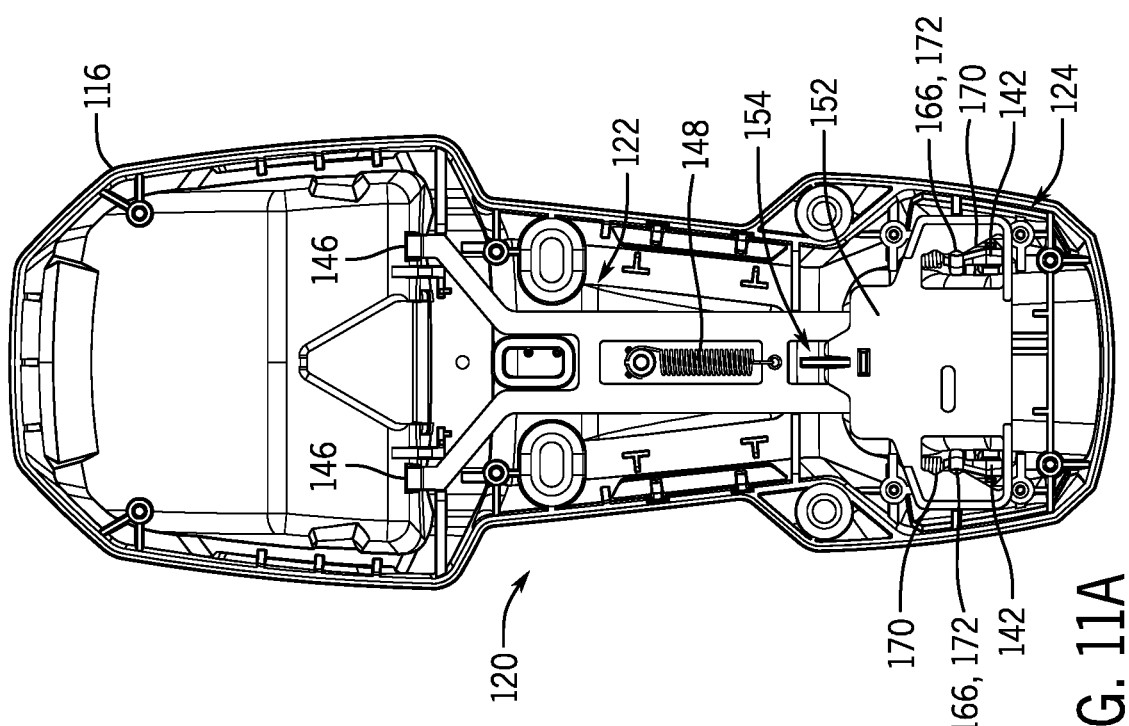

Referring now to FIGS. 11A through 11C, when the latch system 120 is in the second (intermediate retention) latching configuration the protrusion 150 (see FIG. 11C) remains seated freely within the slot 154, although spaced less far apart from the end wall thereof than in the first latching configuration (see FIG. 10C). Accordingly, translation of the latch member 140 is still generally not inhibited by the control member 152 and the biasing force of the spring 148 causes the latch portions 146 of the latch member 140 to extend fully into the head-end well 106 (see FIG. 11B) to engage the reader 102 (see also FIG. 13). However, the control profiles 170 are now aligned so that the protrusion 166 on the latch members 142 are seated in a first set of the indents 172 along the narrower portions 170B of the control profiles 170. Accordingly, via engagement of the control profiles 170 with the protrusions 166, movement of the control body 152 from the first control orientation (see, e.g., FIG. 10A) to the second control orientation (see, e.g., FIG.

11A) has caused the latch members 142 to be rotated to the respective retracted configurations, so that the latch portions 146 thereof extend less far (e.g., not at all) into the base-end well 108 (see FIG. 11B). Accordingly, as the reader 102 is seated on the base station 104, the reader 102 can first displace the latch member 140 against the bias of the spring 148 before receiving the latch portions 146 into corresponding the recesses 176 in the reader 102 (see FIG. 13) to be secured to the base station 104, but the latch portions 162 may not substantially (or at all) engage the recesses 178 (see FIG. 14). Generally, the engagement force of the latch member 140 can thereby still firmly retain the reader 102 on the base station 104, although somewhat less strongly than when the latch system 120 is in the first latching configuration (see FIGS. 10A through 10C).

Referring now to FIGS. 12A through 12C, when the latch system 120 is in the third (least retention) latching configuration the protrusion 150 (see FIG. 12C) is seated against the end wall of the slot 154, with the protrusion 150 having thereby moved the latch member 140, against the bias of the spring 148, from an extended orientation to a retracted orientation (compare FIGS. 11B and 12B). Further, the control profiles 170 are now aligned so that the protrusion 166 on the latch members 142 are seated in a second set of the indents 172 along the narrower portions 170B of the control profiles 170. Accordingly, via engagement of the control profiles 170 with the protrusions 166, the control body 152 can maintain the latch members 142 in the respective retracted configurations (see also FIG. 11B). Accordingly, as the reader 102 is seated on the base station 104, the reader 102 can be slid into both of the wells 106, 108 without necessarily displacing ay of the latch members 140, 142 and the latch members 140, 142 may generally not act to retain the reader 102 on the base station 104 (or at least may retain the reader 102 less strongly than when in the extended configuration).

In the illustrated configuration, the latch system 120 provides little to no latching engagement of the reader 102 when in the third latching configuration (see FIGS. 12A through 12C) and little to no latching engagement of the base end 102B of the reader 102 when in the second latching configuration (see FIGS. 11A through 11C). In other embodiments, however, other configurations are possible. For example, in some embodiments, a control member (e.g., via a feature such as the protrusion 150) can engage a latch, when in particular control orientations, to move the latch to a partially retracted configuration, between a fully extended and fully retracted configuration. Correspondingly, such a latch can retain a handheld device to a full extent, an intermediate extent, or not at all, depending on the orientation of the control body.

As noted above, indents or other similar features on a control profile can in some cases be configured to provide tactile or auditory feedback upon adjustment of a latch system between different latching configurations. In some embodiments, such features can also help to secure a latch system in a particular latching configuration. In the illustrated embodiment, for example, the strength of the torsion springs 168 can be sufficiently large compared to the force of the coil spring 148 that the engagement of the protrusions 166 with the indents 172 (see, e.g., FIG. 12C) can secure the control body 152 in place with the latch member 140 in the retraced configuration, even when the spring 148 urges the control body 152 to translate via engagement of the latch member 140 with the protrusion 150.

In other embodiments, other approaches are possible, including configurations in which other fixed or movable features can help to secure a latch system in a particular latching configuration. For example, in some cases, frictional forces on an adjustment body or a control body can help to secure a particular latch system in a particular latching configuration. This approach may be particularly useful, for example, in configurations for which a base station is installed on a vertical surface or otherwise similarly oriented. For example, with reference to FIGS. 10A through 10C, in a vertical configuration, the force of gravity may tend to urge the control body 152 to move downward (from the illustrated perspective). This type of movement could, in some cases, result in loss of the desired latching configuration. However, with appropriate frictional engagement between the control body 152 and the housing 112 or between the adjustment body 126 and the housing 112 (see FIG. 4), such movement of the control body 152 can be resisted. Thus, a selected latching configuration (e.g., the first latching configuration as shown in FIGS. 10A through 10C) can be maintained regardless of the orientation of the relevant base station.

In the illustrated embodiment, as can be seen by comparison between FIGS. 11B and 12B, the latch members 142 are maintained in generally the same orientation (e.g., fully retracted) in the second and third latching configurations. Correspondingly, as shown in FIG. 9 in particular, the control profiles 170 exhibit generally constant distance from the translational axis 152A of the control body 152 along the entire narrower portion 170A thereof, other than at the indents 172 which themselves exhibit a common depth along the control profile 170. In other embodiments, however, other configurations are possible, including configurations in which an intermediate latching configuration only partially retracts a particular set of latches (e.g., a set of rotational latches) as compared to a fully extended and fully retracted configuration.

As discussed generally above, many of the components described herein can exhibit reversed configurations in some embodiments. For example, in contrast to the pin 132 on the adjustment body 126, some camming arrangements can include adjustment bodies with slots that engage pins on a control body. Similarly, although the control body 152 is illustrated as having the protrusion 150 that extends into the slot 154 on the latch member 140, some configurations can include a latch member with a protrusion that engages a corresponding slot on a control body, to similar effect. As another example, in some cases, a control profile may be an external profile or may be oriented laterally in a reversed direction, as compared to the internal, laterally inwardly oriented configuration of the control profiles 170.

Although secure retention of a handheld device on a base station can be useful, it may also be useful to configure latch systems to allow relatively easy engagement of a handheld device with a base station. In this regard, in some embodiments, configurations that require less force to dock a handheld device to a base station than to remove the device from the base station can result in improved ease of use for users while also reducing unnecessary wear on a base station or a reader. Correspondingly, in some embodiments, a latch portion of a latch member can be configured to provide easier engagement of a handheld device with a base station than disengagement of the handheld device from the base station.

Figure 15A:
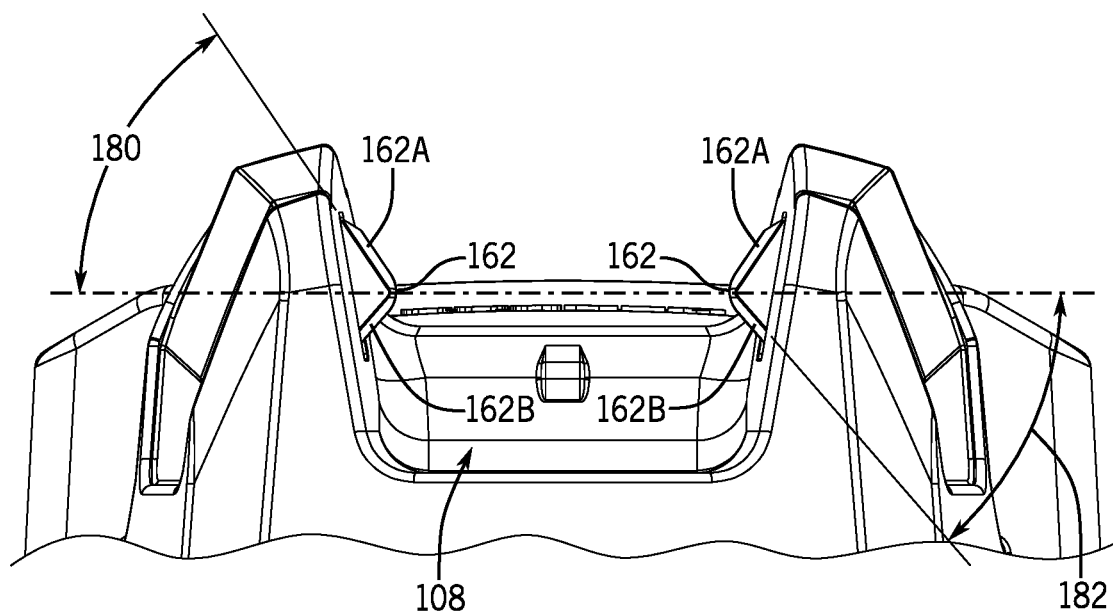
FIGS. 15A and 15B are partial views of the base station of FIG. 1, including the multi-point latch system of FIG. 3, illustrating certain geometrical aspects of the multi-point latch system.
Figure 15B:
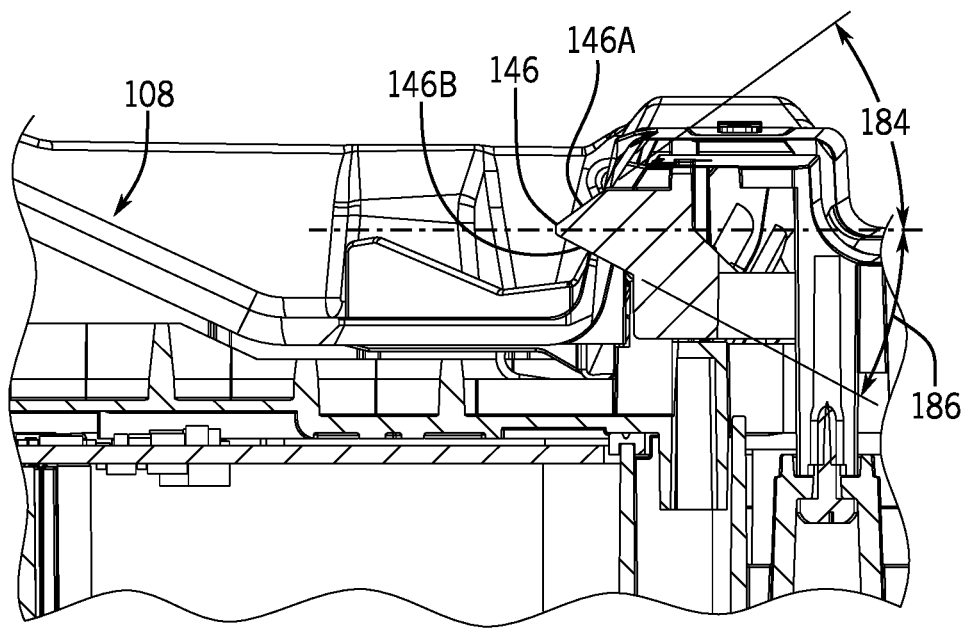

As shown in FIG. 15A, for example, the latch portions 162 of the latch members 142 exhibit different angles 180, 182 on an entrance side 162A and a retention side 162B thereof, respectively. In particular as measure relative to a lateral reference line, the angle 180 on the entrance side 162A is somewhat larger than the angle 182 on the retention side 162B. Correspondingly, a greater upward force is required to overcome the resistance of the springs 168 and remove the reader 102 from engagement with the latch members 142 than is required to overcome the resistance of the springs 168 to dock the reader 102 on the base station 104. Similarly, because an angle 184 on an entrance side 146A of the latch portion 146 of the latch member 140 is larger than an angle 186 on a retention side 146B of the latch portion 146, as measured relative to a longitudinal reference line, a greater upward force is required to overcome the resistance of the spring 148 and remove the reader 102 from engagement with the latch member 140 than is required to overcome the resistance of the spring 148 to dock the reader 102 on the base station 104.

Figure 13:
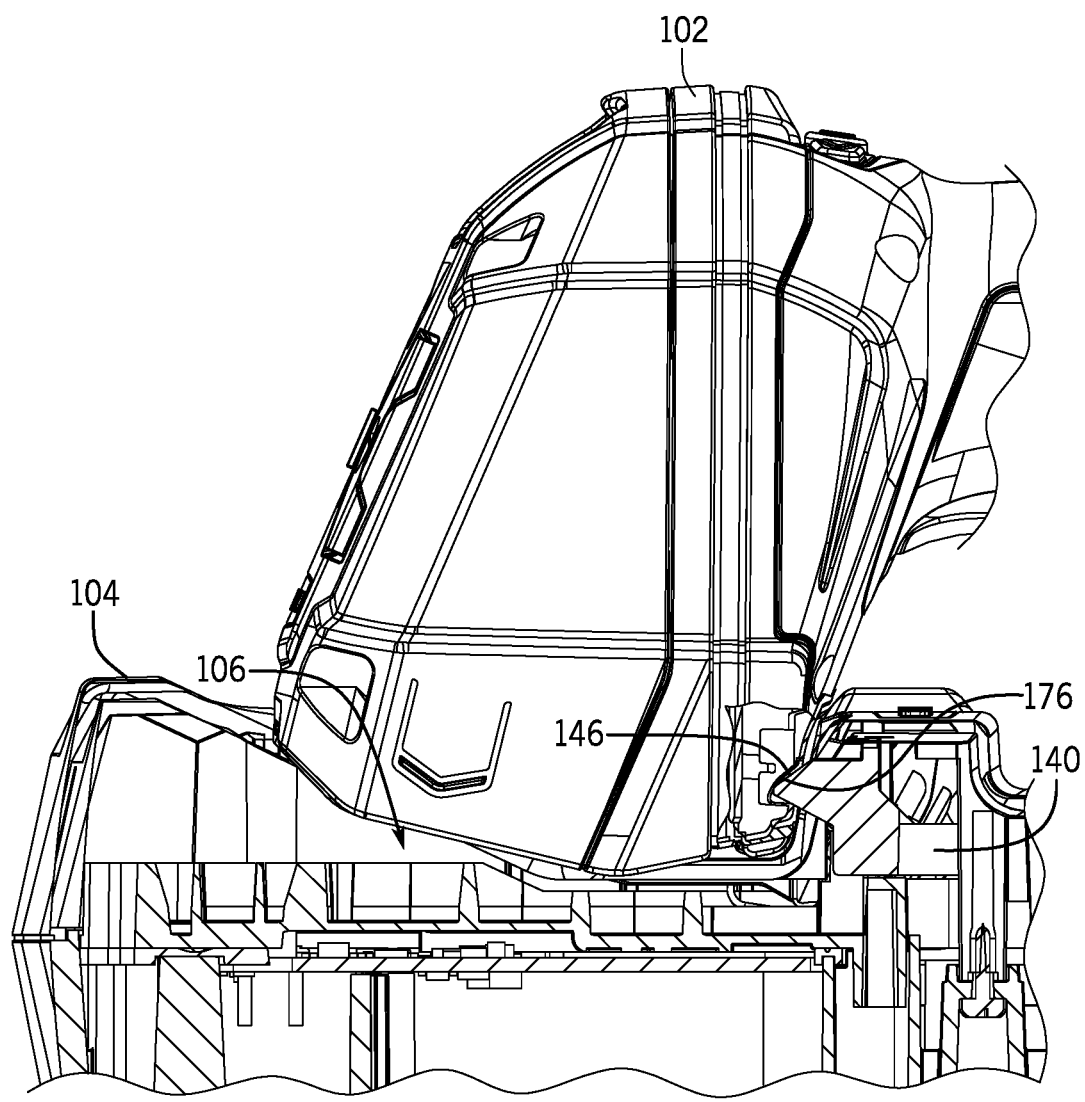
FIG. 13 is a side elevation view of the handheld reader and the base station of FIG. 1, showing a cross-section of the base station taken along plane 13-13 of FIG. 1 and with part of the handheld reader removed to show a latch engagement, with the multi-point latch system of FIG. 3 in the first or the second latching configuration.
Figure 14:
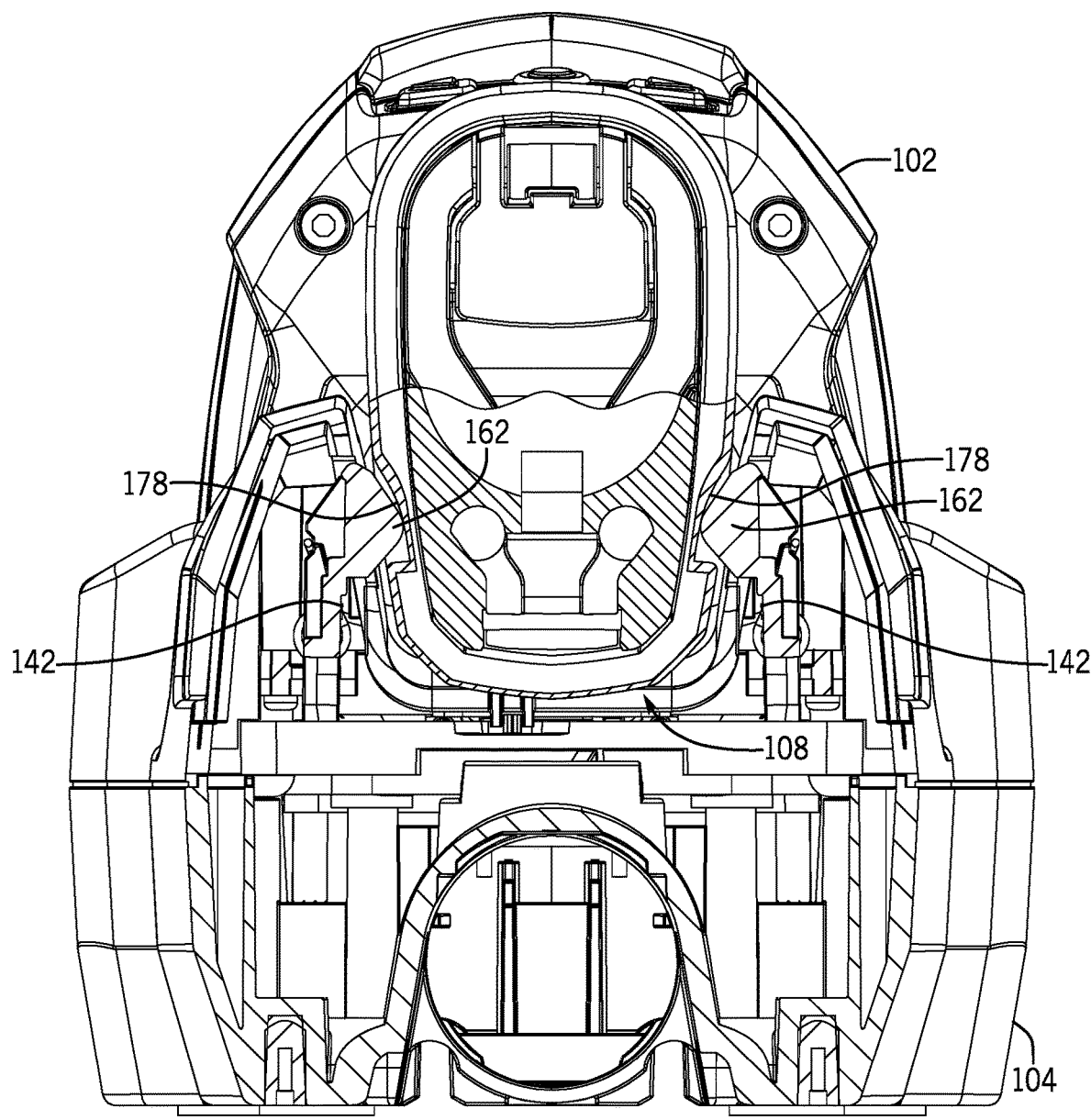
FIG. 14 is a cross-sectional view of the handheld reader and the base station of FIG. 1, taken along plane 14-14 of FIG. 1, with the multi-point latch system of FIG. 3 in the first latching configuration.

In some embodiments, a similar arrangement can be provided on a recess or other catch feature that is configured to be engaged by a latch portion of a latch member. For example, as shown in FIGS. 13 and 14, engagement surfaces of the recesses 176, 178 that are configured to be engaged by the retention sides 146B, 162B of the latch portions 146, 162, respectively, exhibit relatively small angles relative to longitudinal or lateral reference lines, which may further contribute to relatively high-strength retention of the reader 102 by the latch system 120. And, in contrast, other features on the reader 102, such as rounded exterior contours of the housing thereof, can beneficially cooperate with the entrance sides 146A, 162A of the latch portions 146, 162 to further contribute to relatively easy docking of the reader 102 on the base station 104.

With a handheld device appropriately docked on a base station, it may be useful to exchange electrical signals between the device and the base station, such as to charge a battery of the device or transmit data to or from the device. As also noted above, in some embodiments of the technology, a multi-hinge system can be configured to durably provide electrical connections between handheld devices and base stations (or between other devices), including by providing rolling frictional engagement between electrical contacts. In some embodiments, a multi-hinge system for electrical connections can be employed separately from a latch system. In some embodiments, as further discussed below, a multi-hinge system for electrical connections can be employed in combination with a latch system according to the disclosed technology, including latch systems configured similarly to the latch system 120 (see FIGS. 3 through 15B).

FIGS. 16 through 19 schematically illustrate the components and operation of an example multi-hinge system 200 that can provide an electrical connection between a handheld device and a base station when the handheld device is docked on the base station. In the illustrated example, movable components of the multi-hinge system are primarily included on a base station 204, to provide an electrical connection with a reader 202. In other embodiments, however, other configurations are possible, including generally reversed arrangements, with movable components primarily on a reader (or other handheld device). Further, although the base station 204 and the reader 202 can be generally similar to the base station 104 and the reader 102 in some embodiments, other embodiments can include differently configured devices.

In particular, the multi-hinge system 200 includes a first hinge member 206 that is rotatably secured to a body of the base station 204 so as to be rotatable relative to the base station 204 about a first pivot axis 210. Further, the first hinge member 206 includes a docking contact 208. Generally, a docking contact on a hinge member can be disposed, at least with the relevant hinge member in a rest orientation, to be available to contact another device during a docking operation, so that the docking operation rotates the hinge member. In this regard, for example, the docking contact 208 of the first hinge member 206 is configured to extend to the exterior of a housing of the base station 204 when the hinge member 206 is in a rest orientation (see, e.g., FIG. 16). Relatedly, in some cases, the first hinge member 206 can be biased towards the rest orientation, although no biasing member for the first hinge member 206 is shown in FIGS. 16 through 19.

The multi-hinge system 200 also includes a second hinge member 212 that is rotatably secured to the first hinge member 206 so as to be rotatable relative to the first hinge member 206 about a second pivot axis 214 that is supported on the first hinge member 206 opposite the first pivot axis 210 from the docking contact 208. Further, the second hinge member 212 supports an electrical contact 216 that is configured for electrical communication with a power source (e.g., internal or external to the base station 204) or a processor device configured to electrical transmission of information via the electrical contact 216. In particular, the second hinge member 212 includes a non-conductive holder 218 that is rotatably secured to the first hinge member 206 at the second pivot axis 214, and the electrical contact 216 is fixedly secured to the holder 218, although other configurations are possible.

In some embodiments, an electrical contact can be configured to be sufficiently and appropriately flexible so as to itself provide a hinge member for a multi-hinge system. For example, an electrical contact can be formed as a resiliently flexible electrical contact that includes one or more preformed and elastically deformable wires (e.g. spring wires), one or more preformed and elastically deformable metal strips or sheets, or other components with appropriate mechanical and conductive properties (e.g., fully elastic response over an expected range of motion, etc.). In this regard, for example, the resiliently flexible configuration of the electrical contact 216 as illustrated can result in the electrical contact 216 being rotatable relative to the holder 218, around a third pivot axis 220 that moves relative to the holder 218 and the first hinge member 206 during operation of the system 200. In this regard, it should be noted that some hinged movement described herein may not trace a strictly circular profile, including due to deformation of the relevant hinging member or to a movable pivot axis.

Thus, in the illustrated configuration, the multi-hinge system 200 effectively includes three hinge members (including the electrical contact 216), each of which rotates about a distinct pivot axis 210, 214, 220, and two of which—i.e., the second hinge member 212 and the electrical contact 216—are configured to rotate along with and independently of one or more of the others—i.e., the first hinge member 206, and the first and second hinge members 206, 212, respectively. Further, the pivot axes 210, 214, 220 are generally parallel with each other, which may lead to particularly smooth and durable operation of the system 200. In other embodiments, however, other configurations are possible, including configurations with one or more non-parallel pivot axes, configurations with different combinations of fixed or movable pivot axes, configurations with greater or fewer numbers of hinge members or pivot axes, configurations with overlapping rather than offset pivot axes, and so on.

During operation, for the illustrated example, a user can move the reader 202 towards the base station 204 with an electrical contact 222 of the reader 202 generally aligned with the electrical contact 216 of the base station 204. With the reader 202 appropriately aligned, the reader 202 can be moved towards the base station 204 so as to be eventually seated thereon (e.g., as shown in FIG. 1). In some embodiments, including as discussed above, a base station or a handheld device can include features, including wells, guide features, and so on, that can help to ensure appropriate alignment of the handheld device with the base station for the handheld device to be docked with appropriate engagement of corresponding electrical contacts. In some embodiments, including as further discussed below, a multi-hinge system can also include similarly purposed alignment features, including relative to the geometry of particular docking and electrical contacts.

Figure 17:
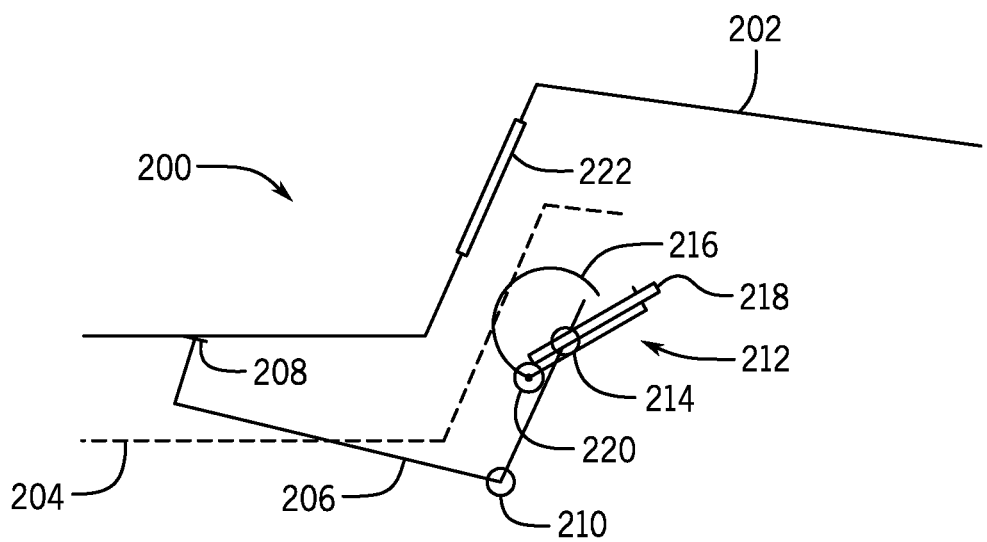
Figure 18:
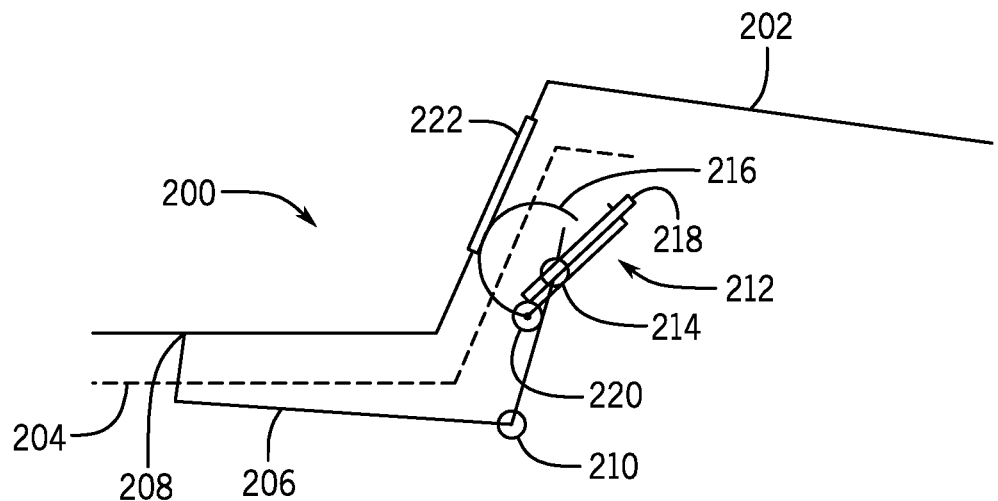

During docking operations for the reader 202 and the base station 204, as shown in FIG. 17, the reader 202 eventually contacts the docking contact 208 and, as shown in FIG. 18, thereby causes the first hinge member 206 to rotate about the first pivot axis 210. Because the first hinge member 206 supports the holder 218 and the electrical contact 216, this rotation of the first hinge member 206 also generally rotates the holder 218 and the electrical contact 216 about the first pivot axis 210. Accordingly, with sufficient movement of the reader 202 towards the base station 204, the electrical contact 216 can be caused to extend outside of the housing of the base station to engage (e.g., directly contact) the electrical contact 222 of the reader 202.

Figure 19:
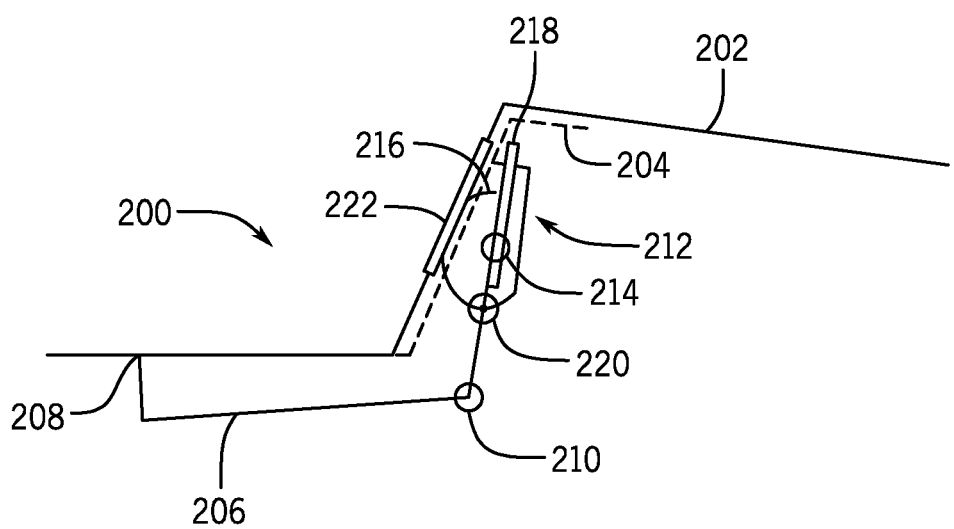

At the configuration shown in FIG. 18, the electrical contacts 216, 222 may be sufficiently engaged with each other to provide electrical communication between the base station 204 and the reader 202. However, the reader 202 may not yet be fully seated (i.e., may be only partially docked rather than fully docked) on the base station 204. Accordingly, the reader 202 may continue to be moved towards the base station 204 toward a fully seated orientation, as shown in FIG. 19. With this further movement of the reader 202, engagement between the electrical contacts 216, 222 can cause a corresponding rotation of the multi-hinge system 200. For the illustrated embodiment, as shown in FIG. 19 in particular, the engagement between the electrical contacts 216, 222 can cause the electrical contact 216 to rotate about the (moving) pivot axis 220, relative to the holder 218 and to the first hinge member 206, and can also cause rotation of the holder 218 relative to the first hinge member 206. Thus, the electrical contact 216 can generally roll, rather than slide, along the electrical contact 216, thereby substantially reducing the potential for frictional wear and correspondingly increasing the durability of the electrical contacts 216, 222, while still ensuring appropriate engagement force (e.g., 1 N or more) between the electrical contacts 216, 222 for reliable electrical communication (e.g., for charging or data transmission).

Thus, in the illustrated embodiment, the multi-hinge system 200 operates as a three-hinge system, with separate rotating movement of the first hinge member 206, the holder 218, and the electrical contact 216 during a docking operation and with generally reversed rotation, due to biasing springs (not shown), during un-docking. Further, some of the noted components rotate in opposing directions at certain stages of a docking (or un-docking) operation and about different pivot axes. For example, as shown in FIGS. 17 and 18, during initial docking engagement between the reader 202 and the base station 204, each of the first hinge member 206, the holder 218, and the electrical contact 216 rotates in a first direction (e.g., counterclockwise, as shown) about the first pivot axis 210. As docking continues, as shown in FIGS. 18 and 19, the first hinge member 206 continues to be rotated in the first direction about the first pivot axis 210 (carrying the holder 218 and the electrical contact 216), and engagement between the electrical contacts 216, 222 causes the electrical contact 216 to rotate in a second direction about the pivot axis 220 (e.g., clockwise, as shown) while also causing further rotation of the holder 218 in the first direction, about the second pivot axis 214.

Accordingly, even as the reader 202 may no longer directly cause rotation of the first hinge member 206, e.g., due to the docking contact 208 having been moved to the interior of the base station 204, the holder 218 can provide a continued rotation in the same direction, and the electrical contact 216 can counter-rotate relative to the holder 218 (and the first hinge member 206) to ensure appropriate rolling engagement with the electrical contact 222. In some embodiments, as also noted above, this rolling engagement can proceed with reduced (e.g., no) sliding contact between the electrical contacts 216, 222. Thereafter, with the multi-hinge system 200 in a fully actuated orientation, as shown in FIG. 19, electrical communication between the reader 202 and the base station 204 can proceed via the electrical contacts 216, 222.

In different embodiments, certain variations on the principles discussed above are possible. For example, in some embodiments, only two hinging bodies can be used, rather than the three hinging bodies provided by the first hinge member 206, the holder 218, and the electrical contact 216. In some embodiments, an electrical contact can be configured to rotate about a fixed pivot axis, rather than (or in addition to) a movable pivot axis, such as the pivot axis 220, or can be configured not to rotate independently at all. Further, the ratio of arm lengths of various hinge members relative to the respective pivot axes, as well as the location of various pivot axes, can be adjusted in different embodiments to provide an appropriate combination of distances of movement of various components (e.g., of electrical contacts or of certain hinge members), appropriate engagement forces (e.g., engagement force of an electrical contact based on movement of a supporting hinge member by the weight of a reader), appropriate relative disposition of components in certain configurations of the system (e.g., extending or not extending out of a base station housing), and so on.

Figure 16:
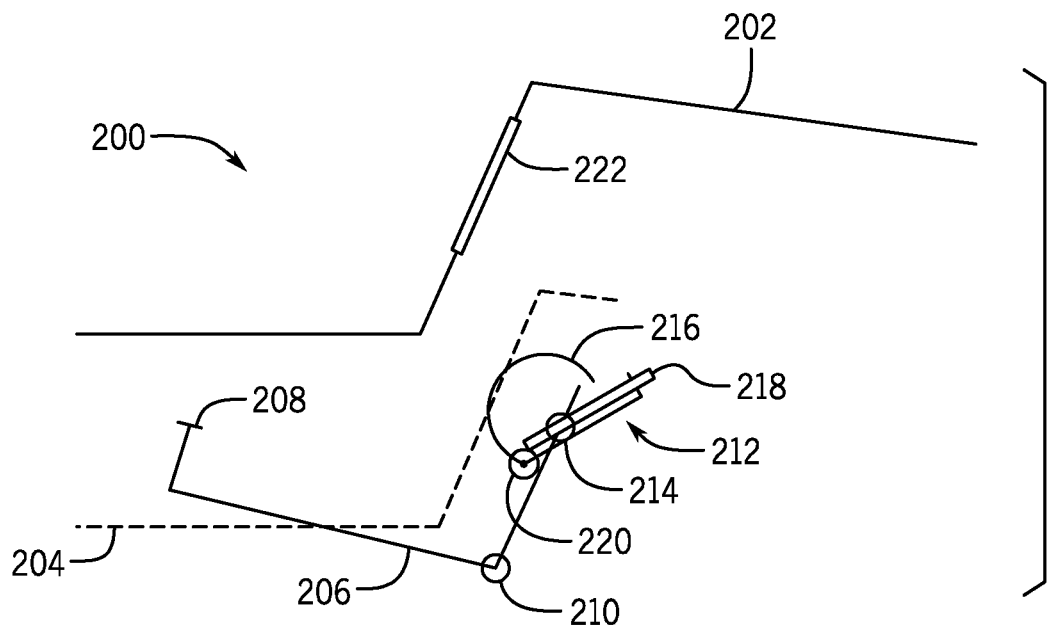
FIG. 16 through 19 are schematic views of operational states of a multi-hinge system for an electrical connection between a handheld reader and a base station.

In some embodiments, as also generally discussed above, one or more hinge members of a multi-hinge system can be rotationally biased in a particular direction. For example, the first hinge member 206 can be mechanically (or otherwise) biased to rotate towards a rest orientation (e.g., in a counter-clockwise direction, as illustrated), so that the docking contact 208 can be automatically positioned to engage a reader (e.g., as shown in FIG. 16) when no reader is currently supported on the base station 204. As another example, the holder 218 can also be biased to rotate to a rest orientation (e.g., in a counter-clockwise direction, as illustrated), so that the holder 218 can reset similarly to the first hinge member 206 when a reader is not engaged with the base station 204. Still further, as also noted above, the electrical contact 216 can also be biased (e.g., self-biased) to return to a rest orientation (e.g., in a clockwise direction, as illustrated) when not engaged by a reader.

In some embodiments, as alluded to above, activation of a multi-hinge system to appropriately establish electrical contact can be achieved based primarily (e.g., solely) on the weight of a reader or other handheld device. For example, hinge members on a base station can be configured so that the locally applied weight of a reader, as the reader is being docked on the base station, is sufficient to rotate the hinge members to establish effective, rolling contact between electrical contacts of the reader and the base station. In this regard, for example, the weight of a reader may sometimes be sufficient to ensure that an electrical contact of a base station is moved to extend appropriately out of the base station (e.g., through an opening in the housing thereof) to engage an electrical contact of the reader. Further, in some embodiments, a latch system (e.g., as discussed above) can also help to ensure appropriate electrical contact, including by securing a reader to a base station in an orientation that ensures appropriate activation of a multi-hinge system for electrical communication.

As similarly noted with regard to the latching discussed above, some embodiments of a multi-hinge system according to the technology can exhibit a reversed configuration than is illustrated in FIGS. 16 through 19. For example, some configurations may include multiple hinge members that are rotatably secured to reader (or other handheld device) in order to provide rolling frictional engagement with an electrical contact on a base station.

Figure 20:
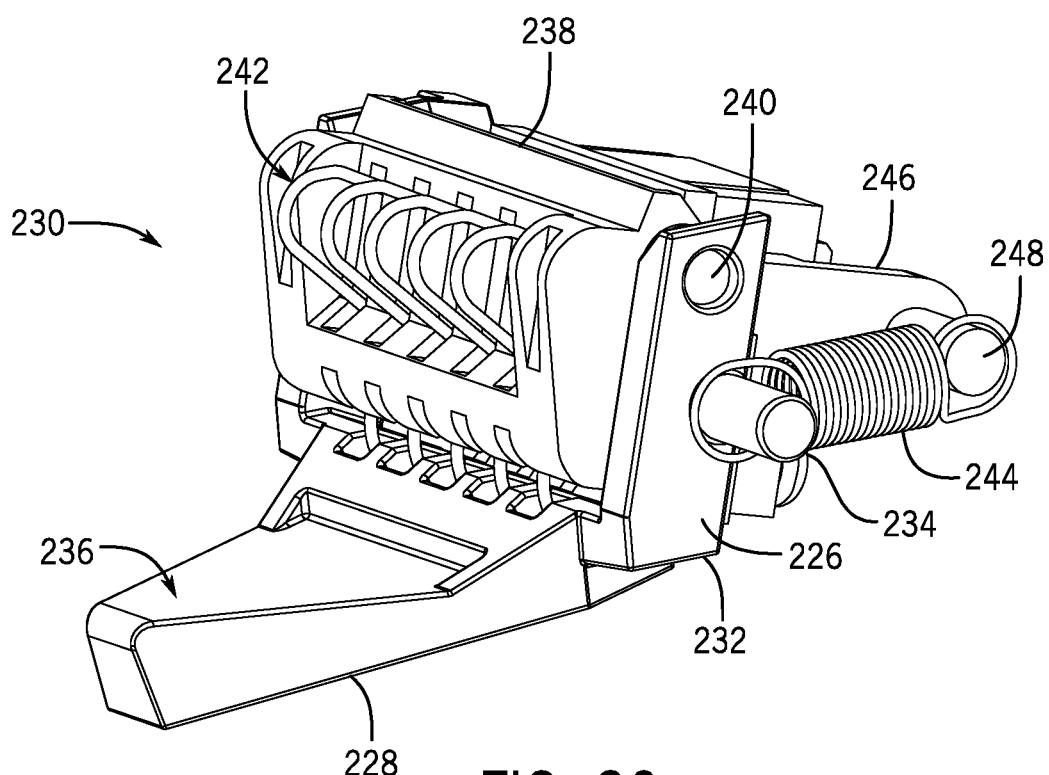
FIG. 20 illustrates components of a multi-hinge system for an electrical connection, for use with a base station similar to the base station of FIG. 1.

FIG. 20 illustrates another example hinge arrangement 230 for a multi-hinge system for electrical contact, which can operate generally similarly to the hinge arrangement of the multi-hinge system 200 (see FIGS. 16 through 19). In particular, the hinge arrangement 230 includes a first hinge member 232 formed as a non-conductive unitary body, with a pin 234 that defines a first pivot axis and a first hinge arm 228 that angles upwardly relative to the pin 234 while also exhibiting a profiles that tapers towards a docking contact region 236 at a free end thereof. As further discussed below, this and other angled or tapered configurations of a docking contact can help to ensure appropriate contact between a reader (or other device) and a multi-hinge system as well as reduce the likelihood of damage to sensitive parts of the reader (or other device) during docking operations. In other embodiments, other configurations are possible.

Still referring to FIG. 20, the hinge arrangement 230 further includes a second hinge member 238, configured as a non-conductive holder, a connection portion of which is pivotally secured with a pin 240 to a support portion of a second hinge arm 226 of the first hinge member 232, opposite the pin 234 from the first hinge arm 228. The second hinge member 238 fixedly supports one end of an electrical contact 242 formed as a set of flexible, resilient, preformed wires (e.g., configured to operate as a rotary spring, as in the illustrated example), which can be fully elastic over an expected range of motion during operation (i.e., can fully return to an initial state, such as shown in FIG. 20 after a deforming force from a reader has been removed). Further, the second hinge member 238 is rotationally biased by a spring 244 that extends between the pin 234 and a biasing arm 246 and pin 248 of the second hinge member 238. Although not shown in FIG. 20, the first hinge member 232 can also be rotationally biased relative to a support structure (e.g., of a base station), including with a bias in the same rotational direction as provided by the spring 244, or otherwise.

Generally, the hinge arrangement 230 can operate similarly to the hinge arrangement of the multi-hinge system 200 of FIGS. 16 through 19. For example, as a handheld device is docked on a base station that includes the hinge arrangement 230, the handheld device can successively engage the docking contact region 236 and the electrical contact 242 to successively rotate the first hinge member 232, the second hinge member 238, and the electrical contact 242 about offset, parallel pivot axes and thereby provide a rolling contact between the electrical contact 242 and an electrical contact of the handheld device.

Figure 21:
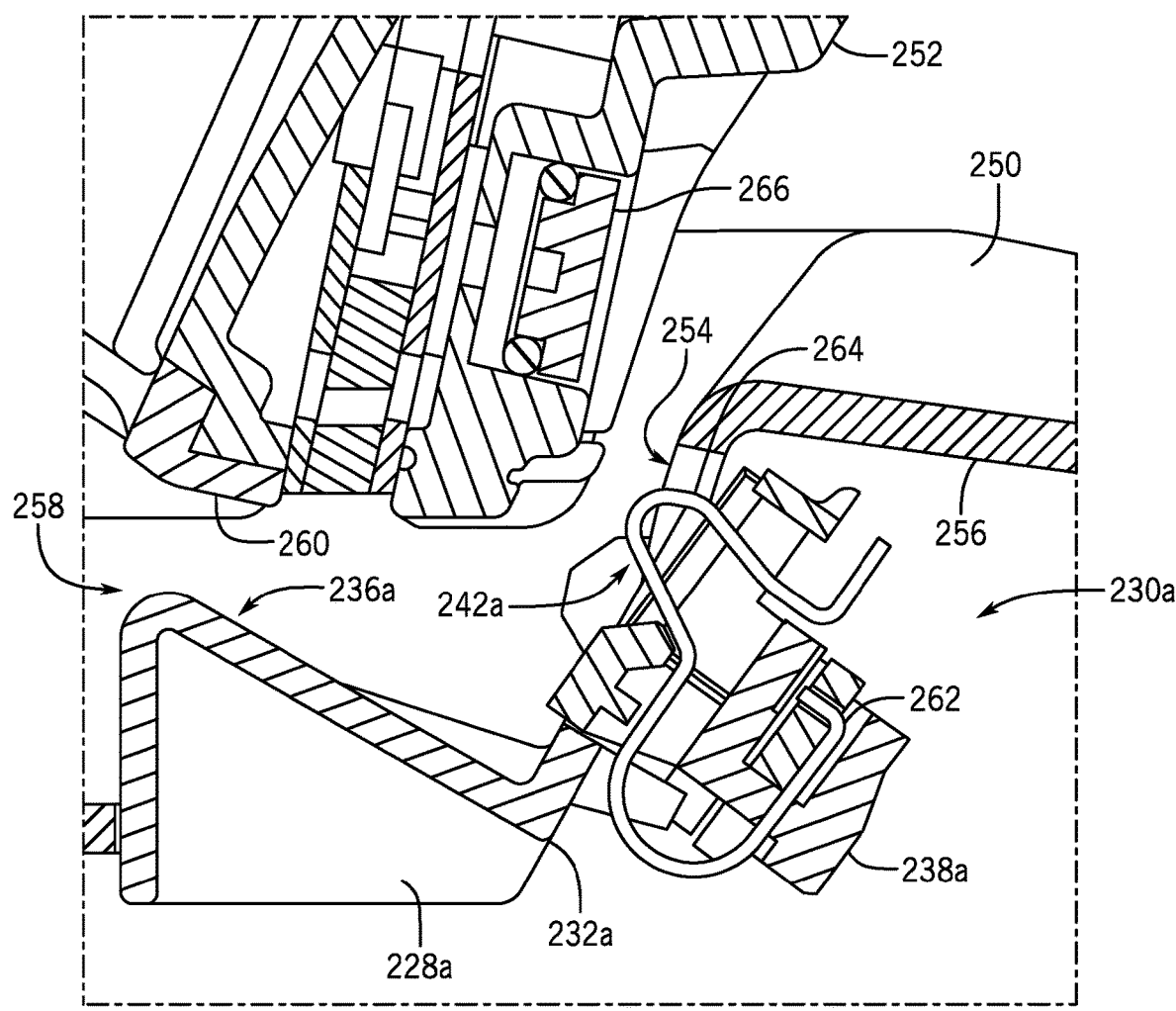
FIGS. 21 through 24 illustrate operational states of the multi-hinge system of FIG. 20 during docking of a reader on a base station.

As another example, a hinge arrangement 230a is illustrated in FIGS. 21 through 24 as part of a base station 250, for use with a handheld reader 252. The hinge arrangement 230a is generally similar to the hinge arrangement 230 and corresponding reference numbers are used herein, with an appended "a". Thus, for example, as shown in FIGS. 21 through 24, the hinge arrangement 230a includes a first hinge member 232a that is rotatably secured to a housing 256 of the base station 250 and a second hinge member 238a that is rotatably secured to the first hinge member 232a and supports an electrical contact 242a that is formed from a plurality of resiliently flexible wires configured to operate as rotary springs, which can be fully elastic over an expected range of motion during operation (i.e., can fully return to an initial state, such as shown in FIG. 21 after a deforming force from a reader has been removed). Although not illustrated in FIGS. 21 through 24, springs or other biasing members can be provided to rotationally bias the hinge members 232a, 238a similarly to the hinge members 232, 238 as discussed above.

Figure 22:
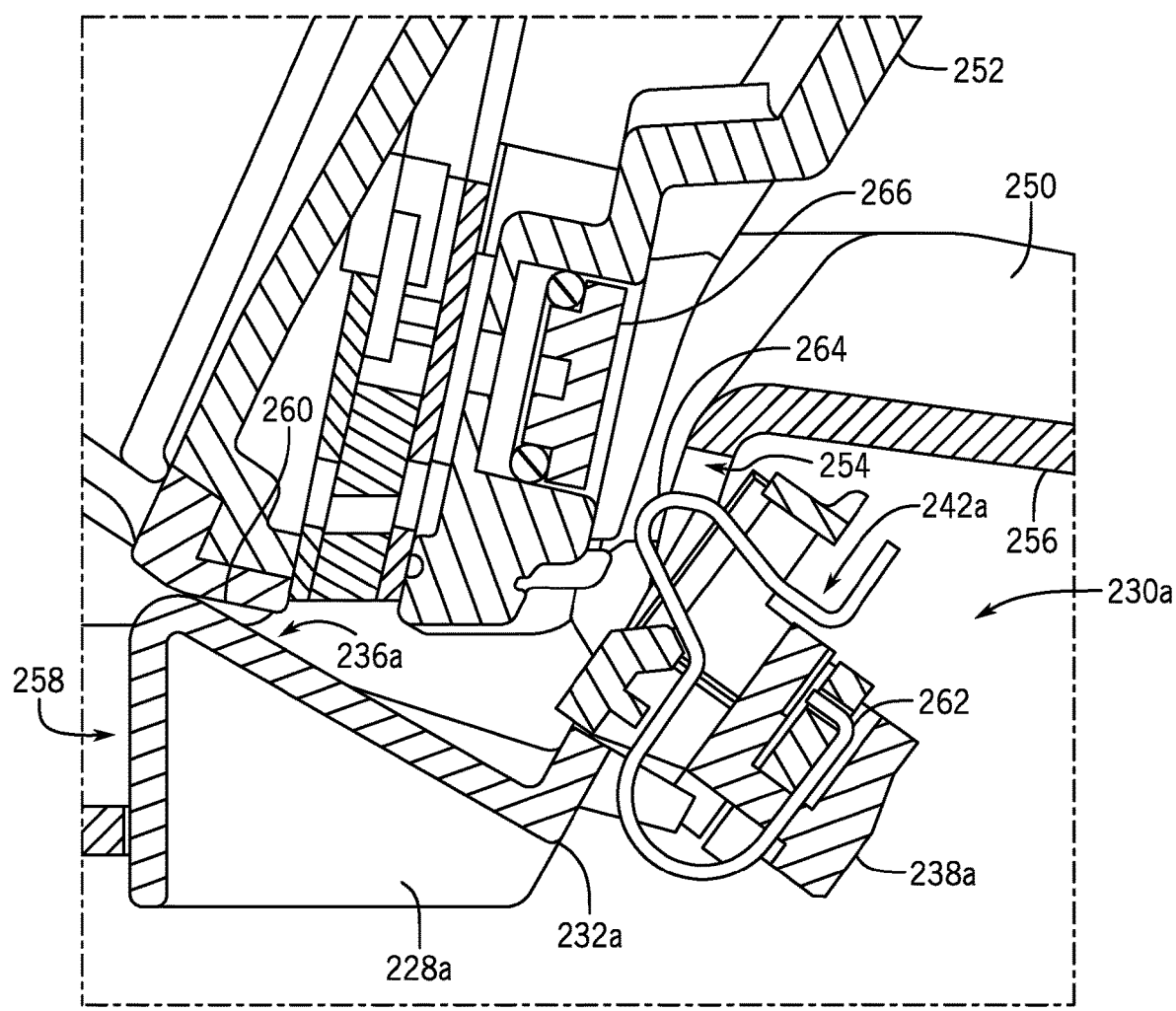

As shown in FIG. 21 in particular, with the hinge arrangement 230a in a rest orientation, a docking contact region 236a of the first hinge member 232a extends through an opening 254 of a housing 256 of the base station 250 into a well 258 defined by the housing. Thus, as shown in FIG. 22 in particular, the tapered, angled, docking contact region 236a is disposed to contact a central area 260 (e.g., protrusion) on a head of the reader 252 as the reader 252 is docked into the well 258. Accordingly, as also discussed above, contact between the docking contact region 236a can be limited to particular (e.g., hardened or otherwise robust) areas on the reader 252 and the hinge arrangement 230a can be activated without risk of damage to sensitive parts of the reader 252. Further, by providing a relatively small contact area for engaging the reader 252, the tapered geometry of the docking contact region 236a can help to ensure that the reader 252 appropriately actuates the hinge arrangement 230a, regardless of the initial orientation of the reader 252 during the start of a docking operation. In this regard, guide features such as the side walls of the well 258 or others (e.g., similar to the protrusions 110 shown in FIG. 3) can also be helpful.

In some embodiments, as alluded to above, it may be useful for an electrical contact to be somewhat protected by a housing when a hinge arrangement is in a rest orientation. Still referring to FIG. 21, for example, the electrical contact 242a includes a connection portion 262 that is fixedly (e.g., non-rotatably) secured to the second hinge member 238a and a bent contact portion 264 that extends away from the connection portion 262 and is configured to engage an electrical contact 266 on the reader 252. With the hinge arrangement 230a in the rest orientation, as shown, the bent contact portion 264 extends only slightly through the opening 254 in the housing 256. Thus, the housing 256 can generally protect the electrical contact 242a from damage when a reader is not docked on the base station 250a. In some configurations, an electrical contact may not extend to the exterior of a housing at all, when in a rest orientation, or may extend to the exterior of a housing to a greater degree than is shown in FIG. 21. In some configurations, an electrical contact may be substantially enclosed within a housing when in a rest orientation, i.e., a majority of a length of the electrical contact may be within the housing, including 85%, 90%, or 95% of the electrical contact in some cases.

In the illustrate embodiment, the opening 254 accommodates all of the multiple wires of the electrical contact 242a (only one wire shown) as well as the docking contact region 236a. In other embodiments, other configurations are possible. For example, multiple openings can allow a docking contact and an electrical contact, respectively, to extend to the outside of a housing, or multiple openings can be provided for multiple conductors of an electrical contact. In some embodiments, parts of a reader may be configured to extend into a housing of a base station to actuate or electrically engage with corresponding parts of a multi-hinge arrangement. For example, an electrical contact may be exposed to the outside of a housing via an opening, but may not be configured to extend through the opening to the outside of the housing to provide an electrical connection with a reader (or other device). Similarly, a docking contact may be exposed to the outside of a housing without necessarily extending through an associated opening of the housing, and a contact area of a reader (or other device) may be configured to extend through the opening, into the interior of the housing, to move a hinge member over part or all of its rotational range during a docking operation.

Figure 23:
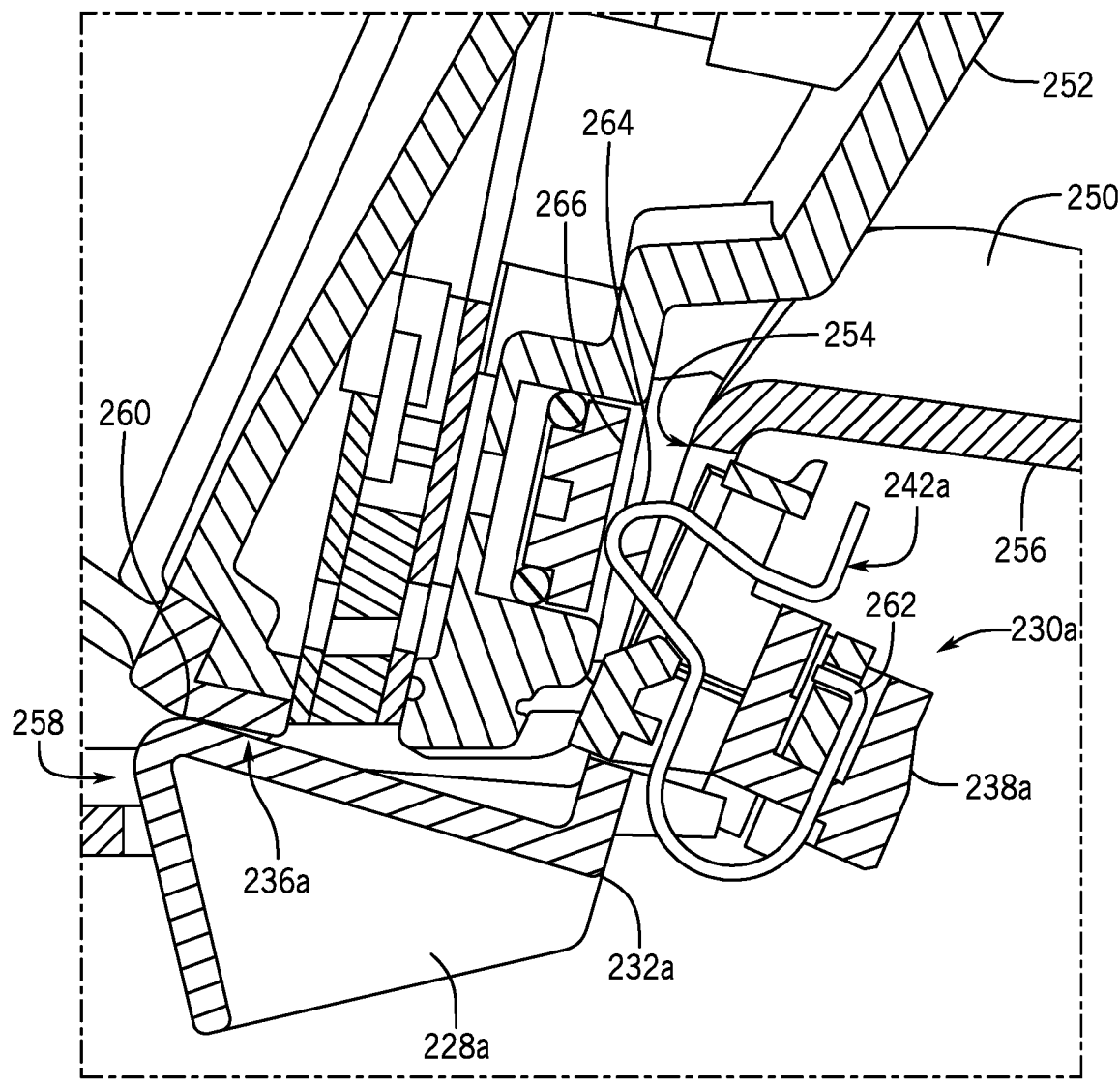

Referring to FIGS. 22 and 23, as the reader 252 moves closer to the base station 250, the contact portion 264 of the reader 252 can engage the docking contact region 236a and thereby rotate the first hinge member 232a in a first direction (e.g., counterclockwise, as shown) about a first pivot axis. This rotation can, in turn, rotate the second hinge member 238a (with the first hinge member 232a) about the first pivot axis, toward the reader 252, until the electrical contact 242a of the hinge arrangement 230a, as shown in FIG. 23, engages the electrical contact 266 on the reader 252 (e.g., a contact plate or other conductive body).

Figure 24:
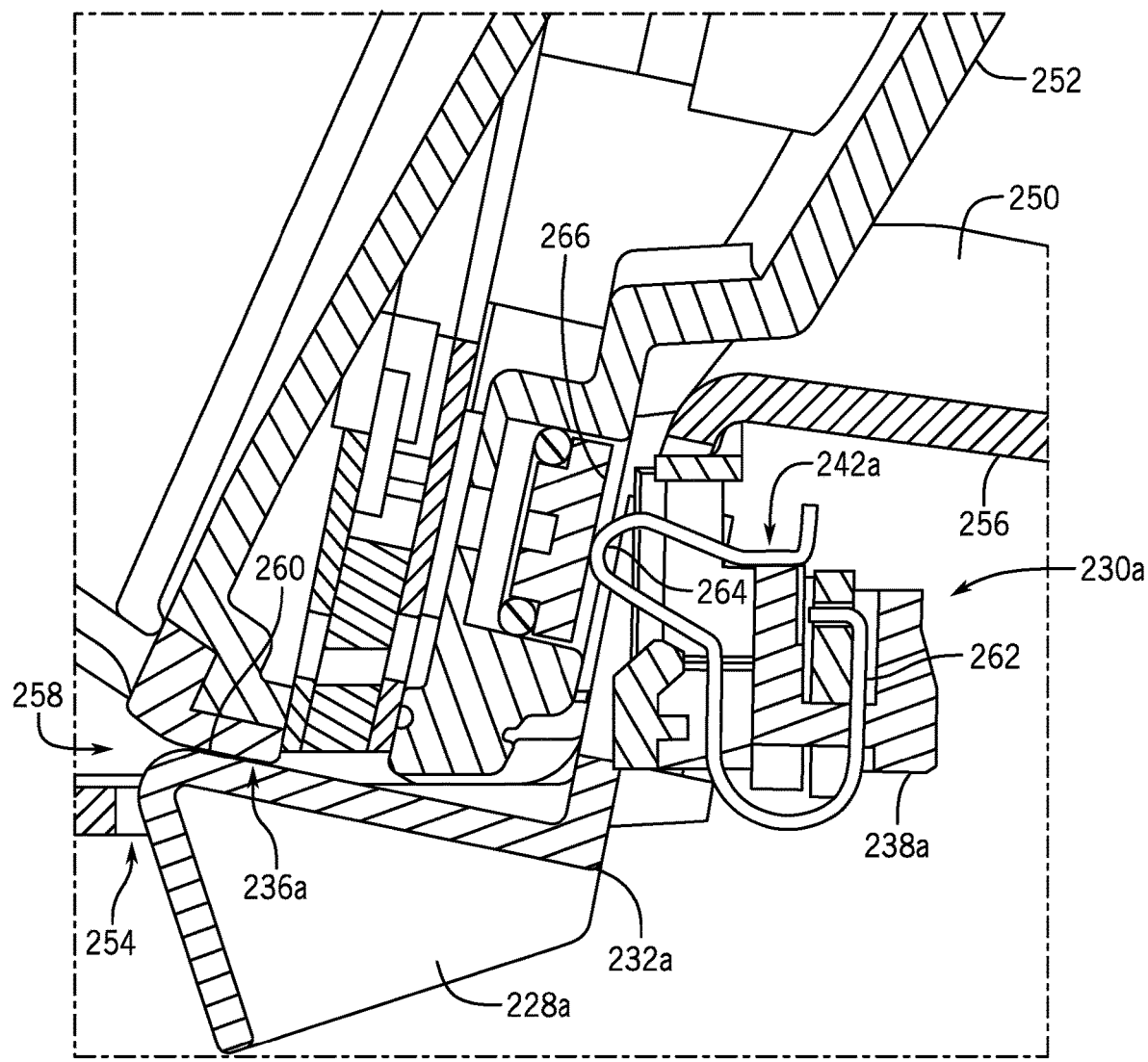

As the docking operation continues, as shown in FIGS. 23 and 24, further movement of the reader 252 can rotate the second hinge member 238a and the electrical contact 242a, via engagement between the electrical contact 242a and the electrical contact 266. In particular, in the illustrated embodiment, the reader 252 causes the second hinge member 238a to rotate in the same direction as the first hinge member 232a, about an offset parallel pivot axis, while the first hinge member 232a, carrying the second hinge member 238a and the electrical contact 242a, continues to be rotated about the first pivot axis by the engagement between the contact portion 264 of the reader and the docking contact region 236a. In contrast, the reader 252 causes the electrical contact 242a to rotate in a second, opposite direction (e.g., clockwise, as shown) relative to the first and second hinge members 232a, 238a, about a third parallel, offset, and movable pivot axis. Accordingly, rolling engagement can be maintained between the electrical contacts 242a, 266, with corresponding benefits to system durability, as also discussed above.

In some embodiments, rotation of a first electrical contact for rolling engagement with a second electrical contact can be accompanied by deformation of one or both of the electrical contacts. For example, as shown in FIGS. 23 and 24, the electrical contact 242a is somewhat deformed during rotation, and may remain somewhat deformed as long as the hinge arrangement 230a remains in the fully actuated orientation (see FIG. 24), despite being generally anchored at the connection portion 262 by the main body of the second hinge member 238. With appropriate resiliency of the electrical contact 242a, this deformation may further contribute to appropriate engagement (e.g., appropriately high normal force) between the electrical contacts 242a, 266 by resulting in an inherent biasing of the electrical contact 242a toward the electrical contact 266. Further, upon removal of the reader 252 from the base station 250, the electrical contact 242a can resiliently return to its rest orientation (and original shape).

In some cases, a reader may be fully docked before a first hinge member reaches its maximum actuated rotational orientation or before a docking contact has been moved to be recessed within a housing (e.g., as shown in FIG. 24). In some embodiments, when a reader is fully docked, a first hinge member may be at its maximum actuated (rotational) orientation or a docking contact may have been moved to be recessed within a housing. In this regard, for example, a hinge arrangement can sometimes include stops to limit total rotation of certain components thereof, and such stops may sometimes indirectly stop movement of a reader at the end of a docking operation. As another example, stops on a housing to directly limit movement of a reader during a docking operation can indirectly stop rotation of a hinge arrangement when a docking operation has been completed, by stopping movement of the reader.

Figure 25:
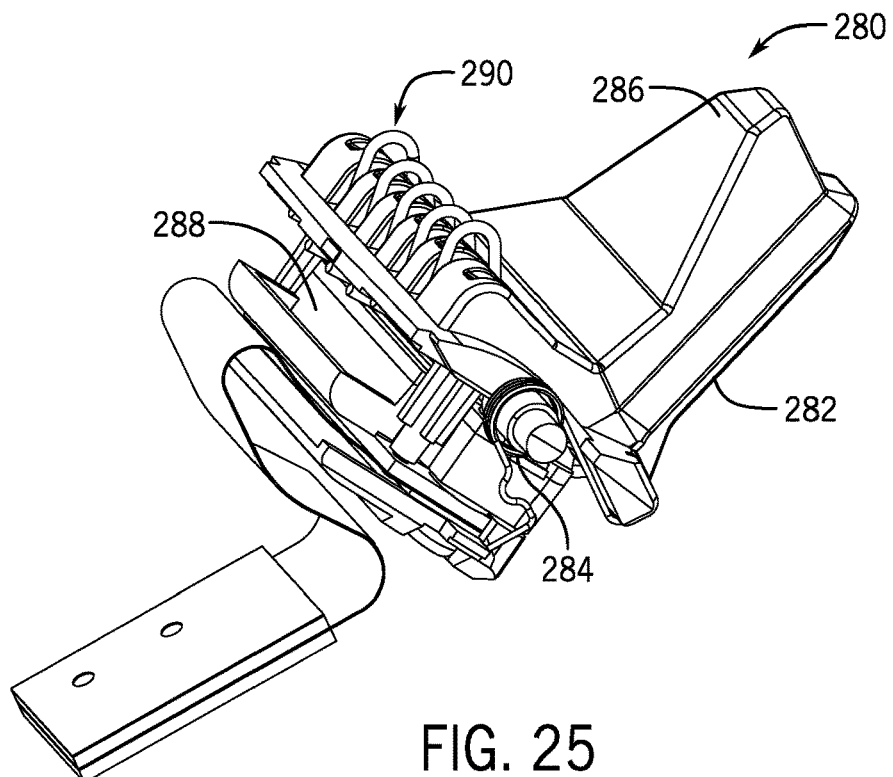
FIG. 25 illustrates components of another multi-hinge system for an electrical connection.

In some embodiments, an electrical contact can be configured to alone serve as a second hinge member of multi-hinge arrangement, to be rotated with and relative to a first hinge member during a docking operation. For example, a multi-hinge system 280, as shown in FIG. 25, includes a first hinge member 282 that is generally similar to the first hinge members 232, 232a (see FIGS. 20 and 21), with a torsion spring 284 that is configured to rotationally bias a tapered, angled docking contact 286 towards a handheld device (not shown in FIG. 25). The multi-hinge system 280 also includes a non-conductive body 288 that secures an electrical contact 290 to the first hinge member 282 opposite the pivot axis of the first hinge member 282 from the docking contact 286. Accordingly, the electrical contact 290, configured in this example as a set of preformed spring wires, can rotate relative to the first hinge member 282 upon engagement with an electrical contact of a reader. In contrast to the second hinge member 238, however, the body 288 is rigidly, rather than rotatably, secured to the first hinge member 282. Therefore, the body 288 generally moves in unison with the first hinge member 282 during operation, even as the electrical contact 290 serves as a hinge member, rotating relative to the first hinge member 282 based on contact with a handheld device.

Figure 26:
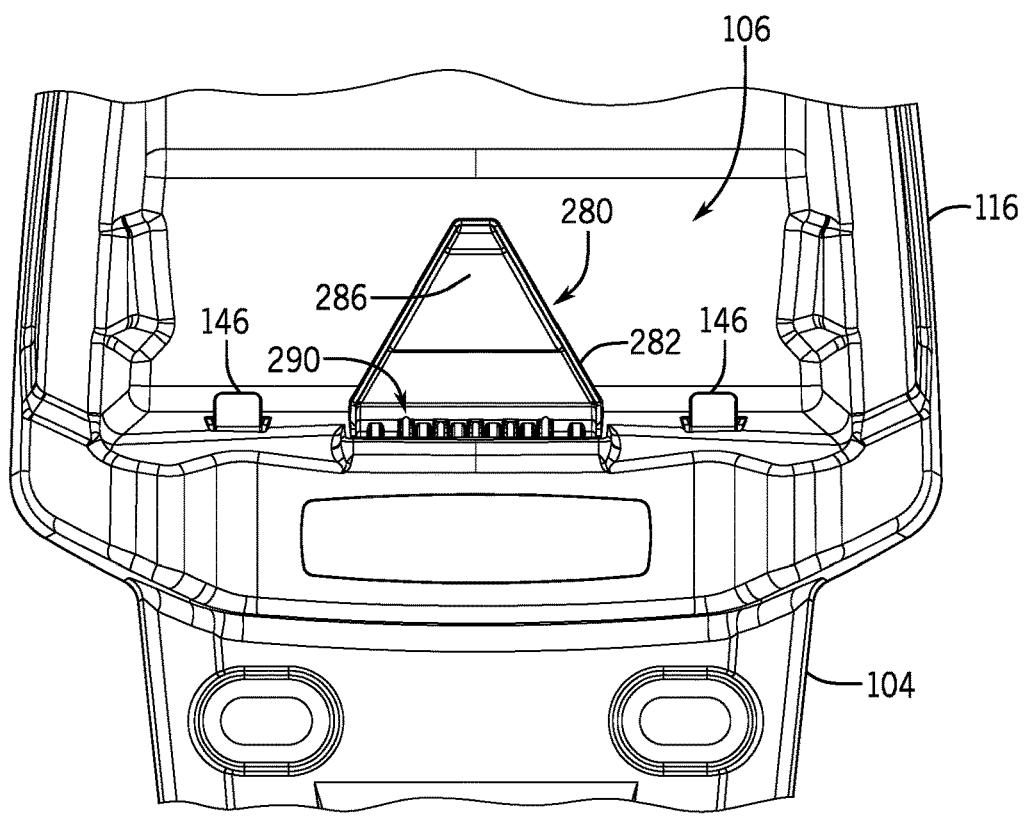
FIG. 26 is a top partial view of the base station of FIG. 1, as equipped with the multi-hinge system of FIG. 25.
Figure 27:
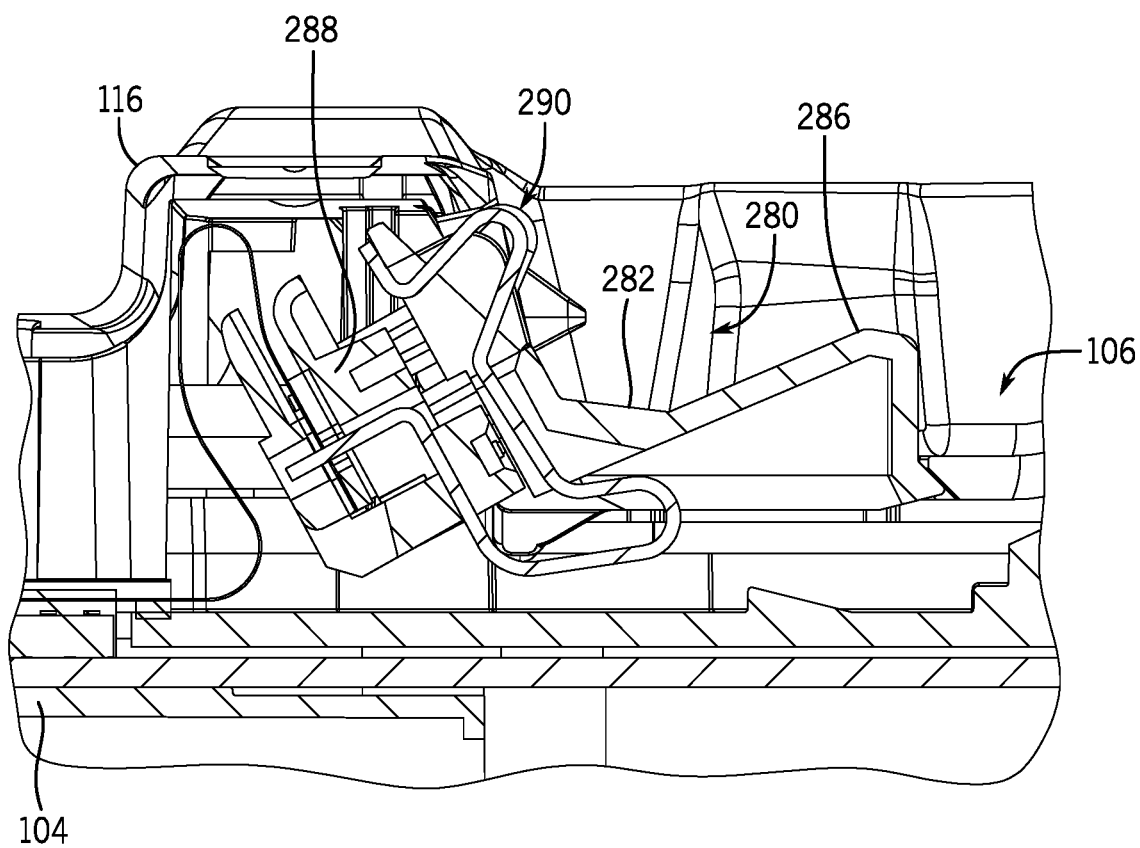
FIG. 27 is a cross-sectional partial view of the base station of FIG. 26, taken along plane 27-27 of FIG. 26, showing the multi-hinge system of FIG. 25.

In some embodiments, as illustrated in FIGS. 26 and 27, the multi-hinge system 280 can be installed with the base station 104 of FIGS. 1 and 2. Thus, as also shown in FIG. 3, the electrical contact 290 can be generally protected by the cover 116 of the housing 112, while still being exposed to the exterior of the housing 112, via an opening 292 in the cover 116, to engage an electrical contact of a reader. Further, the docking contact 286 can angle upwardly and taper laterally inwardly within a central region of the head-end well 106 between the latch portions 146 of the latch system 120.

With this arrangement, as the reader 102 or another device is docked on base station 104, the reader can engage with and rotate the multi-hinge system 280 similarly to the hinge arrangement 230, but without the intermediate rotation of a hinge member such as the second hinge member 238. For example, the reader 102 can initially contact the docking contact 286 to rotate the first hinge member 282 until the electrical contact 290 is moved to contact an electrical contact plate on the reader 102 (not shown, but similar in some cases to the electrical contact 266 of FIG. 21). With further movement of the reader 102 towards the base station 104, the electrical contact 290 can then be rotated by the reader 102, in an opposite direction to the first hinge member 282, to provide an appropriately forceful rolling engagement between the electrical contact 290 and the electrical contact of the reader 102.

In some arrangements, different sub-systems of a base station and handheld device system can interoperate to provide combined benefits for overall operation of the system. For example, as also discussed above, latch systems according to some embodiments of the technology can help to secure handheld devices to base stations in a variety of orientations (e.g., horizontal or vertical) and contexts (e.g., in areas subject to impacts or vibrations). In some embodiments, a latch system can also help to ensure appropriate contact between electrical contacts of a handheld device and a base station to ensure appropriate charging or data transfer for the handheld device regardless of the overall system orientation (e.g., horizontal, vertical, or otherwise).

For example, considering the hinge arrangement 280 of FIGS. 25-27, the weight of the reader 102 (see FIG. 1) on the base station 104 (see FIG. 1) when the base station 104 is in a horizontal orientation may be sufficient to establish and maintain appropriate electrical engagement between the reader 102 and the electrical contact 290 (see, e.g., FIG. 27) for charging of the reader 102 (or other electronic operations). However, when the base station 104 is oriented differently, the changed direction of gravitational forces may result in a corresponding change in the gravity-induced interaction between electrical contacts of the reader 102 and the base station 104. In this regard, however, when in an appropriate latching orientation (e.g., as shown in FIGS. 10A-10C), the latch system 120 can help to ensure that appropriate electrical engagement between the reader 102 and the base station 104 is nevertheless maintained. For example, when the base station 104 is oriented vertically (see, e.g., FIG. 2), the latch system 120 can help to ensure that the reader 102 is maintained in appropriate alignment with the hinge arrangement 280, so that the weight of the reader 102 on the base station 104, despite the non-horizontal orientation of the system, is still sufficient to maintain electrical engagement between the reader 102 and the base station 104. Similar other benefits can also be obtained using other latch systems (or orientations) and hinge arrangements as generally disclosed herein.

Consistent with the discussion above, and as generally reflected in FIGS. 16 through 27, a variety of different implementations of the technology for electrical contacts are possible. In some cases, for example, a base station for a handheld device contains a housing, a first hinge member and a second hinge member. The first hinge member includes a docking contact and is rotatably secured to the housing. The second hinge member includes a base-station electrical contact and is rotatably secured to the first hinge member. When the first hinge member is in a rest orientation, the docking contact is exposed to an exterior of the housing that can be contacted by the handheld device as the handheld device is partially docked on the base station. The handheld device then causes the first hinge member to be rotated in a first direction to move the base-station electrical contact into engagement with the device electrical contact. The second hinge member is configured to rotate in a second direction relative to the first hinge member, due to contact with the device electrical contact, while maintaining rolling contact with the device electrical contact, as the handheld device is fully docked on the base station.

In some cases, the second hinge member may be configured as a flexible conductor that includes the base-station electrical contact and is fixedly secured to the first hinge member. The flexible conductor may include a support portion that is secured to the first hinge member within the housing, and a bent portion that is configured to extend through an opening in the housing to engage the device electrical contact. The flexible conductor may include a pre-formed wire or sheet metal body configured to operate as a rotary spring. In some cases, the second hinge member may include a non-conductive body that is rotatably secured to the first hinge member and a resiliently flexible conductor that is fixedly secured to the non-conductive body. In some cases, the first hinge member may be biased towards the rest orientation.

In some cases, the first direction of rotation of the first hinge member maybe opposite the second direction of rotation of the second hinge member. The first hinge member may rotate in the first direction about a first axis and the second hinge member may rotate in the second direction about a second axis that is different from the first axis. The second hinge member may be configured to be biased towards the device electrical contact upon being rotated, by engagement with the device electrical contact, in a second direction relative to the first hinge member. The second hinge member may be configured to be deformed as the second hinge member rotates in the second direction.

In some cases, when the first hinge member is in the rest orientation, the base-station electrical contact may be substantially enclosed within the housing. The base-station electrical contact may be configured to be moved to extend outside of the housing by the rotation of the second hinge member in the second direction.

In some cases, as a further example, a base station for a handheld device with a device electrical contact includes a housing, a first hinge member that includes a first pin, a docking contact to a first side of the first pin, and a support portion to a second side of the first pin opposite the first side. The first pin is configured to rotatably secure the first hinge member to the housing for rotation about a first axis through the first pin. The base station also includes a second hinge member that includes a connection portion secured to the support portion of the first hinge member, and a base-station electrical contact that is secured to the connection portion and is configured to rotate relative to the first hinge member about a second axis that is different from the first axis. The docking contact of the base station is exposed to an exterior of the housing with the first hinge member in a rest orientation. The base-station electrical contact is exposed to an exterior of the housing in an actuated orientation. The first hinge member of the base station is configured to rotate in a first direction about the first axis, from the rest orientation, upon contact of the handheld device with the docking contact, to rotate the second hinge member in the first direction about the first axis. The second hinge member is configured to be rotated relative to the first hinge member, in a second direction about the second axis, upon engagement of the base-station electrical contact with the device electrical contact.

In some cases, the second hinge member may be configured to be rotated in the second direction simultaneously with the first hinge member being rotated in the first direction. The base-station electrical contact may be substantially enclosed within the housing when the first hinge member is in the rest orientation. The docking contact and the base-station electrical contact may be exposed to the exterior of the housing via a first opening in the housing. The housing of the base station may include a well configured to receive the handheld device, with the first opening disposed within the well.

In some cases, as a further example, a machine vision system includes of a handheld device with a device electrical contact and a base station. The base station includes a housing with a well configured to receive a head of the handheld device, a first hinge member, and a second hinge member. The first hinge member is secured to the housing for rotation about a first axis and includes a docking contact that extends through a first wall of the well when the first hinge member is in a rest orientation. The second hinge member is secured to the first hinge member for rotation about a second axis that is spaced apart from the first axis, the second hinge member including a base-station electrical contact that extends through a second wall of the well when the second hinge member is in an actuated orientation. The handheld device is configured to be moved into the well to be docked in electrical communication with the base station. The first hinge member is configured to be rotated about the first axis by the handheld device as the handheld device is moved into the well, to move the base-station electrical contact into engagement with the device electrical contact. The second hinge member is configured to be rotated about the second axis by the engagement with the device electrical contact to maintain a rolling, non-sliding contact with the device electrical contact as the first hinge member rotates about the first axis.

In some cases, the first hinge member of the machine vision system may be configured to be rotated in a first direction by the handheld device as the handheld device is moved into the well. The second hinge member may be configured to be rotated in a second direction by the device electrical contact as the first hinge member rotates in the first direction, with the second direction being opposite the first direction. The docking contact of the machine vision system may be formed on a tapered profile, to be disposed to contact only a central region of the handheld device.

Consistent with the discussion above, and as generally reflected in FIGS. 3 through 15B, a variety of different implementations of the technology for latching a handheld device are possible. In some cases, as an example, a base station for a handheld device includes a housing, a first latch, a second latch, and a control body. The first latch i movable relative to the housing between an extended orientation and a retracted orientation, and is configured to retain a first part of the handheld device on the housing in the extended orientation and to release the first part of the handheld device in the retracted orientation. The second latch is movable relative to the housing between an extended orientation and a retracted orientation, and is configured to retain a second part of the handheld device on the housing in the extended orientation and to release the second part of the handheld device in the retracted orientation. The control body is movable relative to the housing between first, second, and third control orientations to selectively dispose the first and second latches in, respectively: a first latching configuration, in which the first and second latches are in the extended orientation; a second latching configuration, in which the first latch is in the extended orientation and the second latch is in the retracted orientation; and a third latching configuration, in which the first and second latches are in the retracted orientation.

In other cases, the control body of the base station may include a control profile that engages a control member of the second latch. The control profile may be configured to move the control member of the second latch to dispose the second latch in the extended orientation or the retracted orientation, depending on the control orientation of the control body, as the control body moves relative to the housing. The control body may be slidably secured to the housing and may be slidable between the first, second, and third control orientations to dispose the first and second latches in the first, second, and third latching configurations, respectively. The control profile may be obliquely angled relative to a direction of movement of the control body to displace the control member of the second latch by different distances, in a direction perpendicular to the direction of movement, depending on the control orientation of the control body. The control profile may include at least one indent to receive the control member of the second latch when the control body is in at least one of the second or third control orientations. The second latch may be rotationally biased within the housing to urge the control member into the at least one indent, to secure the control member at the at least one of the second or third control orientations.

In some cases, the control profile may be configured to rotate the second latch between the extended and retracted orientations. The control member may be configured to slidably move the first latch to the retracted orientation as the control member is moved from the second to the third control orientation. The control member may be configured to slidably move the first latch to the retracted orientation in a parallel direction with sliding movement of the control body. The control member may include one of a control-member protrusion or a control-member slot and the first latch may include, respectively, one of a first-latch slot or a first-latch protrusion. The control-member or first-latch protrusion may be configured to engage a wall of the first-latch or control-member slot, respectively, to move the first latch to the retracted orientation as the control member is moved from the second to the third control orientation.

In some cases, an adjustment body of the base station may be engaged with the control body, and the adjustment body may be configured to be engaged by a user to move the control body between the first, second, and third control orientations. The adjustment body may include a cam member engaged with the control body and may be configured to be rotated relative to the housing, from outside of the housing, to move the control body between the first, second, and third control orientations.

In some cases, the housing of the base station may include a first well to receive a head end of the handheld device and a second well to receive a grip end of the handheld device where the first latch extends into the first well in the extended orientation and the second latch extends into the second well in the extended orientation. The first latch may be biased to extend into the first well substantially in parallel with an elongate direction of the housing and the second latch may be biased to extend into the second well substantially perpendicularly to the elongate direction of the housing. The first latch may include at least two latch portions that are translationally biased to extend into the first well substantially in parallel with the elongate direction of the housing and the second latch may include at least two latch portions that are rotationally biased to extend into the second well from opposite directions.

In some cases, as a further example, a latch system for a base station and a handheld device includes a housing of one of the base station or the handheld device, a first latch member, a second latch member, and a control body. The first latch member includes a first latch portion and a first body portion enclosed by the housing. The first body portion is slidably secured within the housing to be slidable between an extended orientation and a retracted orientation. The first latch portion extending farther out of the housing with the first body portion in the extended orientation than with the first body portion in the retracted orientation. The second latch member includes a second latch portion and a second body portion enclosed by the housing. The second body portion is rotatably secured within the housing to be rotatable between an extended orientation and a retracted orientation. The second latch portion extends farther out of the housing with the second body portion in the extended orientation than with the second body portion in the retracted orientation. The control body is engaged with the first body portion and the second body portion, with the control body being movable relative to the housing between two or more control orientations to selectively dispose the latch system in, respectively, two or more of: a first latching configuration, in which the first and second body portions are in the extended orientation; a second latching configuration, in which one of the first or second body portions is in the extended orientation and the other of the first or second body portions is in the retracted orientation; or a third latching configuration, in which the first and second body portions are in the retracted orientation.

In some cases, the first latch portion of the base station may include at least two latching ends that are extendable out of the housing at separate locations. The base station may include a third latch member that includes a third latch portion and a third body portion enclosed by the housing, the third body portion being rotatably secured within the housing to be rotatable between an extended orientation and a retracted orientation. The control body may be engaged with the third body portion to selectively dispose the third body portion in the extended orientation, the retracted orientation, or the retracted orientation based on the latch system being in the first, second, or third latching configuration, respectively. The control body may include a first control profile and a second control profile that, upon movement of the control body, engage the second and third body portions, respectively, to simultaneously rotate the second and third body portions in opposing directions between the respective extended and retracted orientations. One of the control body or the first body portion may include a protrusion that engages a wall of the other of the control body or the first body portion to slide the first body portion between the extended and retracted orientations upon movement of the control body.

In some cases, as a further example, a base station for a handheld device includes a housing, a first latch member, a second latch member, and a control body. The housing including a first well configured to receive a head end of the handheld device and a second well configured to receive a base end of the handheld device. The first latch member includes a first body portion with one of a slot or a protrusion, and a first latching portion configured to engage the handheld device within the first well. The second latch member includes a second body portion, and a second latching portion configured to engage the handheld device within the second well. The control body includes an angled control profile and one of a protrusion or a slot. The first latch member is biased toward an extended orientation and is slidable within the housing between the extended orientation and a retracted orientation, with the first latching portion extending farther out of the housing to engage the handheld device with the first latch member in the extended orientation than with the first latch member in the retracted orientation. The second latch member is biased towards an extended orientation and is rotatable within the housing between an extended orientation and a retracted orientation, with the second latching portion extending farther out of the housing to engage the handheld device with the second latch member in the extended orientation than with the second latch member in the retracted orientation. The control body is selectively slidable relative to the housing between two or more control orientations to selectively move the first and second latch members from a first latching configuration, in which the first and second latch members are in the extended orientation, to one or more of a second latching configuration or a third latching configuration. In the second latching configuration, the first latch member is in the extended orientation and the angled control profile is engaged with the second body portion to hold the second latch member in the retracted orientation. In the third latching configuration, the one of the protrusion or the slot of the control body is engaged with the one of the slot or the protrusion of the first latch member to hold the first latch member in the retracted orientation and the angled control profile is engaged with the second body portion to hold the second latch member in the retracted orientation.

As generally noted above, in some cases, one or more aspects described for some examples can be combined with or substituted for one or more aspects of other examples. In this regard, some examples can include aspects of a latch system and aspects of a system for electrical contact, as variously described above.

Thus, embodiments of the technology can provide improved docking arrangements between handheld readers and base stations, or other similar combinations of devices. For example, in some embodiments, an adjustable latch system can allow a base station to selectively engage a reader with different degrees of retention, such as may allow the base station and the reader to be used together in a variety of context and orientations. As another example, in some embodiments, a multi-hinge system can be used to provide rolling engagement between electrical contacts of a handheld reader and a base station, which may reduce system wear due to reduction (e.g., elimination) of sliding friction between the electrical contacts and thereby increase system lifespan. In some embodiments, a multi-hinge system can also usefully help to keep electrical contacts protected within a relevant housing when not in use, as may also further improve overall system durability and performance.

The particular embodiments disclosed above are illustrative only, as the technology may be modified and practiced in different but equivalent manners apparent to those skilled in the art having the benefit of the teachings herein. Further, no limitations are intended to the details of construction or design herein shown, other than as described in the claims below. It is therefore evident that the particular embodiments disclosed above may be altered or modified and all such variations are considered within the scope and spirit of the technology. Accordingly, the protection sought herein is as set forth in the claims below.

What is claimed is:

1. A base station for a handheld device with a device electrical contact, the base station comprising:
   a housing;
   a first hinge member that includes a docking contact and is rotatably secured to the housing; and
   a second hinge member that includes a base-station electrical contact and is rotatably secured to the first hinge member;
   the docking contact, when the first hinge member is in a rest orientation, being exposed to an exterior of the housing to be contacted by the handheld device as the handheld device is partially docked on the base station such that the handheld device causes the first hinge member to be rotated in a first direction to move the base-station electrical contact into engagement with the device electrical contact; and the second hinge member being configured to rotate in a second direction relative to the first hinge member, due to contact with the device electrical contact, while maintaining rolling contact with the device electrical contact, as the handheld device is fully docked on the base station.

2. The base station of claim 1, wherein the second hinge member is configured as a flexible conductor that includes the base-station electrical contact and is fixedly secured to the first hinge member.

3. The base station of claim 2, wherein the flexible conductor includes a support portion that is secured to the first hinge member within the housing, and a bent portion that is configured to extend through an opening in the housing to engage the device electrical contact.

4. The base station of claim 2, wherein the flexible conductor includes a pre-formed wire or sheet metal body configured to operate as a rotary spring.

5. The base station of claim 1, wherein the second hinge member includes a non-conductive body that is rotatably secured to the first hinge member and a resiliently flexible conductor that is fixedly secured to the non-conductive body.

6. The base station of claim 1, wherein the first hinge member is biased towards the rest orientation.

7. The base station of claim 1, wherein the first direction is opposite the second direction.

8. The base station of claim 7, wherein the first hinge member rotates in the first direction about a first axis and the second hinge member rotates in the second direction about a second axis that is different from the first axis.

9. The base station of claim 1, wherein the second hinge member is configured to be biased towards the device electrical contact upon being rotated, by engagement with the device electrical contact, in a second direction relative to the first hinge member.

10. The base station of claim 9, wherein the second hinge member is configured to be deformed as the second hinge member rotates in the second direction.

11. The base station of claim 1, wherein, with the first hinge member in the rest orientation, the base-station electrical contact is substantially enclosed within the housing.

12. The base station of claim 1, wherein the base-station electrical contact is configured to be moved to extend outside of the housing by rotation of the second hinge member in the second direction.

13. A base station for a handheld device with a device electrical contact, the base station comprising:
a housing;
a first hinge member that includes a first pin, a docking contact to a first side of the first pin, and a support portion to a second side of the first pin opposite the first side, the first pin being configured to rotatably secure the first hinge member to the housing for rotation about a first axis through the first pin;
a second hinge member that includes a connection portion secured to the support portion of the first hinge member, and a base-station electrical contact that is secured to the connection portion and is configured to rotate relative to the first hinge member about a second axis that is different from the first axis;
the docking contact being exposed to an exterior of the housing with the first hinge member in a rest orientation;
the base-station electrical contact being exposed to an exterior of the housing in an actuated orientation;

the first hinge member being configured to rotated in a first direction about the first axis, from the rest orientation, upon contact of the handheld device with the docking contact, to rotate the second hinge member in the first direction about the first axis; and the second hinge member being configured to be rotated relative to the first hinge member, in a second direction about the second axis, upon engagement of the base-station electrical contact with the device electrical contact.

14. The base station of claim 13, wherein the second hinge member is configured to be rotated in the second direction simultaneously with the first hinge member being rotated in the first direction.

15. The base station of claim 13, wherein the base-station electrical contact is substantially enclosed within the housing when the first hinge member is in the rest orientation.

16. The base station of claim 15, wherein the docking contact and the base-station electrical contact are exposed to the exterior of the housing via a first opening in the housing.

17. The base station of claim 16, wherein the housing includes a well configured to receive the handheld device; and
wherein the first opening is disposed within the well.

18. A machine vision system comprising:
a handheld device with a device electrical contact; and
a base station, the base station including:
a housing with a well configured to receive a head of the handheld device;
a first hinge member that is secured to the housing for rotation about a first axis and includes a docking contact that extends through a first wall of the well when the first hinge member is in a rest orientation; and
a second hinge member that is secured to the first hinge member for rotation about a second axis that is spaced apart from the first axis, the second hinge member including a base-station electrical contact that extends through a second wall of the well when the second hinge member is in an actuated orientation;
the handheld device being configured to be moved into the well to be docked in electrical communication with the base station;
the first hinge member being configured to be rotated about the first axis by the handheld device as the handheld device is moved into the well, to move the base-station electrical contact into engagement with the device electrical contact; and
the second hinge member being configured to be rotated about the second axis by the engagement with the device electrical contact to maintain a rolling, non-sliding contact with the device electrical contact as the first hinge member rotates about the first axis.

19. The machine vision system of claim 18, wherein the first hinge member is configured to be rotated in a first direction by the handheld device as the handheld device is moved into the well; and
wherein the second hinge member is configured to be rotated in a second direction by the device electrical contact as the first hinge member rotates in the first direction, the second direction being opposite the first direction.

20. The machine vision system of claim 19, wherein the docking contact is formed on a tapered profile, to be disposed to contact only a central region of the handheld device.

* * * * *